US009961766B2

(12) United States Patent
Iwase

(10) Patent No.: US 9,961,766 B2
(45) Date of Patent: May 1, 2018

(54) STRETCHABLE CIRCUIT BOARD AND METHOD FOR MANUFACTURING STRETCHABLE CIRCUIT BOARD

(71) Applicant: NIPPON MEKTRON, LTD., Tokyo (JP)

(72) Inventor: Masayuki Iwase, Tokyo (JP)

(73) Assignee: NIPPON MEKTRON, LTD., Tokyo (JP)

(*) Notice: Subject to any disclaimer, the term of this patent is extended or adjusted under 35 U.S.C. 154(b) by 0 days. days.

(21) Appl. No.: 15/278,558

(22) Filed: Sep. 28, 2016

(65) Prior Publication Data
US 2017/0099730 A1 Apr. 6, 2017

(30) Foreign Application Priority Data

Oct. 1, 2015 (JP) .................................. 2015-195684
Dec. 28, 2015 (JP) .................................. 2015-256652

(51) Int. Cl.
H05K 1/00 (2006.01)
H05K 1/02 (2006.01)
H05K 3/36 (2006.01)
H05K 1/03 (2006.01)
H05K 1/09 (2006.01)

(52) U.S. Cl.
CPC ......... *H05K 1/0283* (2013.01); *H05K 1/0393* (2013.01); *H05K 1/092* (2013.01); *H05K 3/365* (2013.01)

(58) Field of Classification Search
USPC ........................................................ 174/254
See application file for complete search history.

(56) References Cited

U.S. PATENT DOCUMENTS

2016/0227623 A1* 8/2016 Yoo ..................... H05B 33/145

FOREIGN PATENT DOCUMENTS

JP 2014-162124 A 9/2014
JP 2014-236103 A 12/2014

* cited by examiner

*Primary Examiner* — Tremesha S Willis
(74) *Attorney, Agent, or Firm* — Westerman, Hattori, Daniels & Adrian, LLP

(57) ABSTRACT

A stretchable circuit board includes a stretchable base, a stretchable wiring portion, a reinforcement base having in-plane rigidity higher than that of the stretchable base, and a draw-out wiring portion. The stretchable wiring portion having stretchability is formed on a main surface located on at least one side of the stretchable base. The draw-out wiring portion is formed at least on a main surface that is one side of the reinforcement base. The main surface of the reinforcement base is overlaid with a part of an area where the stretchable wiring portion is formed, in which the main surface faces the main surface of the stretchable base. A part of the stretchable wiring portion and a part of the draw-out wiring portion are joined together, and they are electrically continuous.

19 Claims, 14 Drawing Sheets

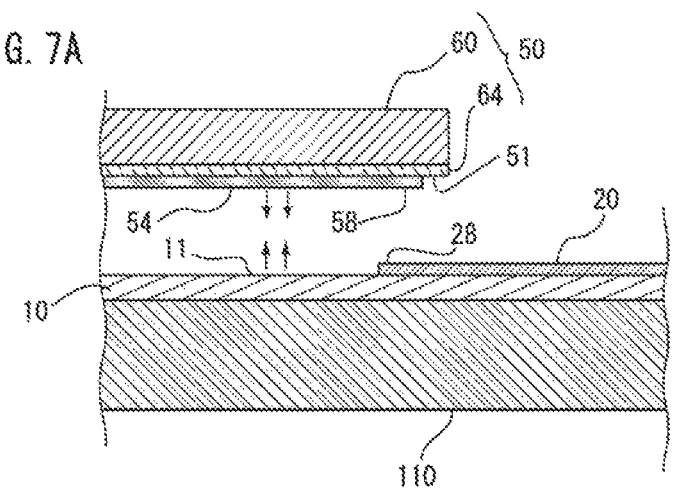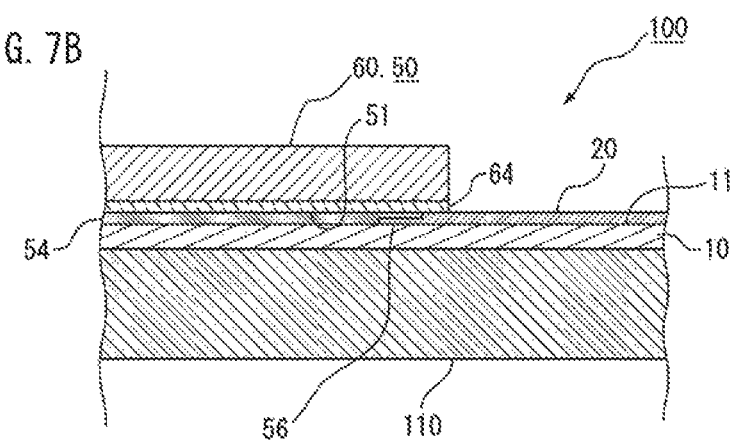

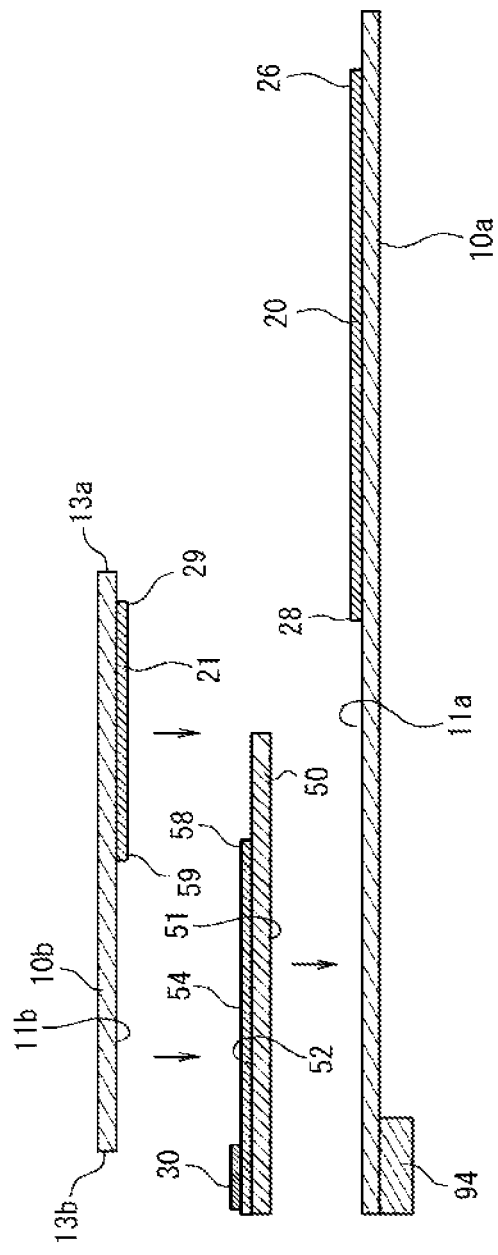

STRETCHABLE CIRCUIT BOARD AND METHOD FOR MANUFACTURING STRETCHABLE CIRCUIT BOARD

CROSS-REFERENCE TO RELATED APPLICATIONS

This application claims the benefit of Japanese Patent Applications No. 2015-195684 filed on Oct. 1, 2015 and No. 2015-256652 filed on Dec. 28, 2015 in the Japanese Patent Office, the disclosures of which are herein incorporated in its entirety by reference.

BACKGROUND OF THE INVENTION

The present invention relates to stretchable circuit boards including a stretchable base and a stretchable wiring portion, and methods for manufacturing the same.

In the wearable device market and the medical device market, biological sensors and biological information monitors have received much attention in recent years. For example, the sports industry has been making an effort to quantify body movements of competitors in a highly precise manner in order to improve competitors' physical ability or skills. In such a case, wearable biological sensors that sense movement of a living body are used in some occasions. In addition, the medical industry has been trying to detect vital signs (biological information) such as electrocardiograms, heart rates, blood pressures, and body temperatures for the purpose of treatment of diseases or taking measures against presymptomatic diseases. In such a case, biological information monitors that sense biological information may be used. In general, these biological sensors or biological information monitors are attached to garments or equipment, and these garments or equipment are worn to perform sensing or monitoring.

However, as a human body moves, these garments or equipment are slightly misaligned from a body. This causes a problem of misalignment of the biological sensor or the biological information monitor from the targeted portion of a living body, resulting in significant deterioration in sensing accuracy or monitoring accuracy.

The problem described above can be prevented if the biological sensor or the biological information monitor is attached directly onto the human body. Thus, in recent years, studies have been made as to a technique called stretchable electronics having a base or wiring that can stretch in in-plane directions, and circuit boards that can stretch in association with movement of joints and the like of a human body are proposed. In a case where biological sensors or biological information monitors are used in medical application or the like, it is desired that at least a portion of the biological sensors that is in contact with a living body or used in the vicinity of the living body should be disposable from the viewpoint of prevention of infectious diseases.

A stretchable circuit board of this type includes a circuit board described in Japanese Patent Application Laid-open No. 2014-236103. This circuit board includes a stretchable base and an electroconductive pattern containing electroconductive microparticles and elastomer, and the entire substrate of this circuit board has stretchability. Furthermore, Japanese Patent Application Laid-open No. 2014-162124 describes a stretchable circuit board, in which an island composed of a material having Young's modulus higher than that of a stretchable base is formed into a thin membrane through a printing method, and is embedded in the base. This island has elements mounted thereon, and individual islands are connected by stretchable wires. This document describes that, with this configuration, it is possible to prevent elements from breaking or prevent breakage of wires extending over a boundary between the island and the base.

SUMMARY OF THE INVENTION

With regards to embodying the biological sensors or biological information monitors, it is preferable that external devices with large mass and high rigidity such as a power supply and a control board are connected outside of the stretchable circuit board, rather than being mounted on the stretchable circuit board, in order to avoid restriction to movements of the target portion of the living body. Thus, there is a demand for a stretchable circuit board having stretchability that allows the board to follow movements of a human body as well as offering excellent handleability at the time of connection with external devices or the like, while exhibiting highly reliable electrical properties. However, the stretchable circuit board described in Japanese Patent Application Laid-open No. 2014-236103 or Japanese Patent Application Laid-open No. 2014-162124 does not take handleability into consideration.

The present invention has been made in view of the problems described above, and provides a stretchable circuit board that has excellent stretchability and handleability while exhibiting highly reliable electrical properties, and a method for manufacturing the stretchable circuit board.

According to the present invention, there is provided a stretchable circuit board, which includes:
  a stretchable base;
  a stretchable wiring portion formed on a main surface located on at least one side of the stretchable base, and having stretchability;
  a reinforcement base having in-plane rigidity higher than that of the stretchable base; and
  a draw-out wiring portion formed on a main surface located on at least one side of the reinforcement base, in which
  the main surface of the reinforcement base is overlaid with a part of an area where the stretchable wiring portion is formed, in a manner such that the main surface of the reinforcement base faces the main surface of the stretchable base, and
  a part of the stretchable wiring portion and a part of the draw-out wiring portion are joined together, and are electrically continuous with each other.

Furthermore, according to the present invention, there is provided a method for manufacturing a stretchable circuit board, which includes:
  forming a stretchable wiring portion having stretchability, on a main surface located on at least one side of a stretchable base;
  forming a draw-out wiring portion on a main surface located on at least one side of a reinforcement base having in-plane rigidity higher than that of the stretchable base; and
  overlaying the main surface of the reinforcement base with a part of an area where the stretchable wiring portion is formed, in a manner such that the main surface of the reinforcement base faces the main surface of the stretchable base, and joining together a part of the stretchable wiring portion and a part of the draw-out wiring portion to cause these parts to be electrically continuous with each other.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7A is an enlarged diagram illustrating a mode in which a stretchable wiring portion and a draw-out wiring portion are joined together, and FIG. 7B is an enlarged diagram illustrating a joining portion;

FIG. 11 is a schematic view illustrating manufacturing processes for a stretchable circuit board;

DESCRIPTION OF THE EMBODIMENTS

Figure 1:
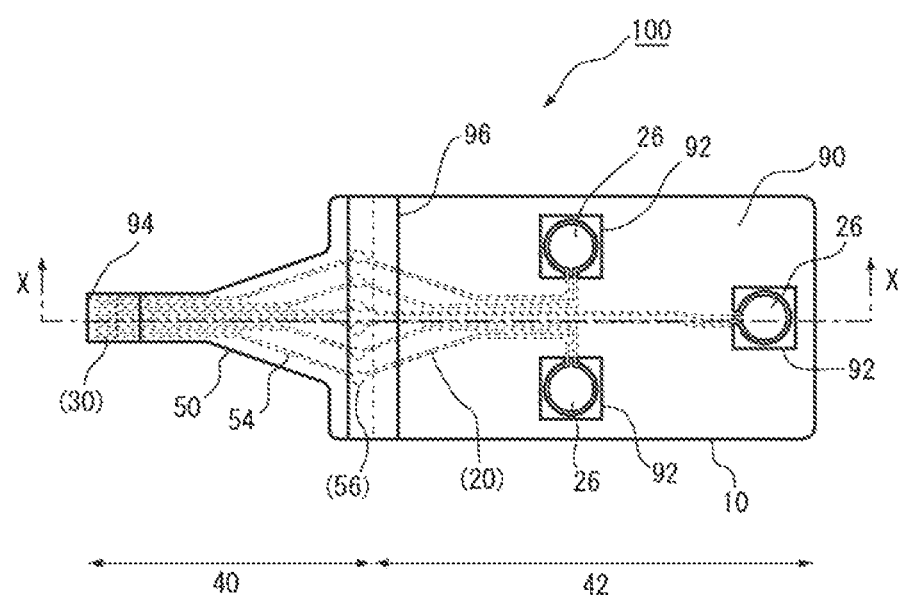
FIG. 1 is a plan view illustrating a stretchable circuit board according to a first exemplary embodiment of the present invention.

Hereinbelow, an exemplary embodiment according to the present invention will be described with reference to the drawings. Note that, in each of the drawings, corresponding constituent components are denoted as the same reference characters, and detailed explanation thereof will not be repeated as appropriate.

It should be noted that the "surface" as used in this specification is not required to be geometrically completely flat, and is allowed to have a recessed portion or a protruding portion formed thereon. Furthermore, the "film" as used in this specification broadly includes a thing that generally has a thin thickness shape, such as a sheet and a film-shaped thing. In other words, difference in name, such as a sheet and a film-shaped thing, does not define the thickness size of the thing.

First Exemplary Embodiment

Figure 2:
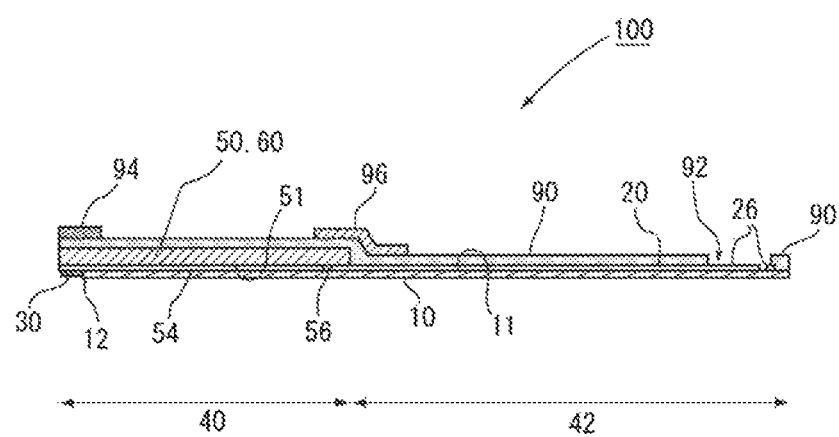
FIG. 2 is a sectional view taken along the line X-X in FIG. 1.

FIG. 1 is a plan view illustrating a stretchable circuit board 100 according to a first exemplary embodiment of the present invention. FIG. 2 is a sectional view taken along the line X-X in FIG. 1. First, the outline of the first exemplary embodiment will be described. For the purpose of convenience, in some cases in the following description, the bottom side in FIG. 2 is called a lower surface side, and the top side in FIG. 2 and the side toward a reader who is looking at FIG. 1 are called an upper surface side. However, these directions are defined for the purpose of convenience with the aim of illustrating relative positional relationships of constituent elements, and do not necessarily match the top or bottom in the gravity direction.

The stretchable circuit board 100 includes a stretchable base 10, a stretchable wiring portion 20, a reinforcement base 50 having in-plane rigidity higher than that of the stretchable base 10, and a draw-out wiring portion 54. The stretchable wiring portion 20 is formed on a main surface 11 located on at least one side of the stretchable base 10, and has stretchability. The draw-out wiring portion 54 is formed on a main surface 51 located on at least one side of the reinforcement base 50.

The main surface 51 of the reinforcement base 50 is overlaid with a part of an area where the stretchable wiring portion 20 is formed, in a manner such that the main surface 51 of the reinforcement base 50 faces the main surface 11 of the stretchable base 10. A part of the stretchable wiring portion 20 and a part of the draw-out wiring portion 54 are joined together, and are electrically continuous with each other.

Here, "joining a part of the stretchable wiring portion 20 and a part of the draw-out wiring portion 54 together" means that a part of a lengthwise area of the stretchable wiring portion 20 and a part of a lengthwise area of the draw-out wiring portion 54 are directly contacted with each other, without intervention of an adhesive or pressure-sensitive adhesive, and are integrated into one piece. The stretchable circuit board 100 according to the first exemplary embodiment is characterized in that the stretchable wiring portion 20 and the draw-out wiring portion 54 are directly joined together. As for joining of other layers (for example, the stretchable base 10 and the reinforcement base 50), it may be possible to use an adhesive or pressure-sensitive adhesive as needed.

The stretchable circuit board 100 has the reinforcement base 50 having in-plane rigidity higher than the stretchable base 10. The reinforcement base 50 is overlaid with a part of the area where the stretchable wiring portion 20 is formed, and this reinforcement base 50 gives stiffness to the stretchable circuit board 100, whereby the stretchable circuit board 100 offers excellent handleability. On the other hand, the other area where the reinforcement base 50 is not provided can offer stretchability, which is a property required for biological sensors or biological information monitors. Furthermore, the stretchable circuit board 100 has a structure in which the stretchable wiring portion 20 and the draw-out wiring portion 54, which are formed on the different bases of the stretchable base 10 and the reinforcement base 50, are overlaid with each other so as to face each other, and parts of these portions are joined together. Thus, each of these wiring portions can be stably formed on a flat base in a manner appropriate according to properties of bases, and hence, the stretchable circuit board 100 has a structure with excellent reliability in terms of electrical properties.

Next, the stretchable circuit board 100 according to the first exemplary embodiment will be described in detail.

The stretchable circuit board 100 includes at least one terminal portion 30, and is used by connecting the terminal portion 30 with various types of external devices. These external devices include a power supply and a control board, and also include a sensing unit that senses movements of the living body, and biological information such as an electrocardiogram, heart rate, blood pressure, and body temperature. With this configuration, the stretchable circuit board 100 may be used as a part of the biological sensor or the biological information monitor. Note that the sensing unit described above may be mounted on the stretchable circuit board 100, and various types of electronic elements such as resistors and capacitors may be mounted on the stretchable circuit board 100. The stretchable circuit board 100 may be used by attaching it on the surface of a human body, and may also be used by placing it to a robot, various types of devices, units, or wearable items.

The stretchable circuit board 100 has a reinforcement area 40, and a stretchable area 42 having in-plane rigidity lower than that of the reinforcement area 40 and also having stretchability. The reinforcement area 40 and the stretchable area 42 each form a partial area of the stretchable circuit board 100 in plan view, and do not overlap with each other. The reinforcement area 40 is an area where the reinforcement base 50 is provided, and the stretchable area 42 is an area where the reinforcement base 50 is not provided. The stretchable area 42 forms the main portion of the area of the main surface of the stretchable circuit board 100, and has an area larger than that of the reinforcement area 40. The stretchable base 10 having stretchability is provided so as to extend over the reinforcement area 40 and the stretchable area 42. Furthermore, a joining portion 56 between the stretchable wiring portion 20 and the draw-out wiring portion 54 is formed in the reinforcement area 40.

The stretchable area 42 has flexibility, and deforms in a surface-normal direction with external force acting in this surface-normal direction (in the top-bottom direction in FIG. 2). The stretchable area 42 also has stretchability, and stretches in in-plane directions with external force acting in the in-plane directions (in the top-bottom and left-right directions in FIG. 1).

The reinforcement area 40 has stretchability in the in-plane directions, and the stretchability thereof is lower than that of the stretchable area 42. The reinforcement area 40 according to the first exemplary embodiment has flexibility, and deforms in a surface-normal direction with external force acting in the surface-normal direction but substantially does not stretch in the in-plane directions. The reinforcement area 40 has appropriate rigidity (stiffness) as with flexible print circuit boards or flexible flat cables, and is a portion used by connecting it with an external device (not illustrated) such as a controller and an external substrate. The reinforcement area 40 functions to connect an electrode portion 26 formed in the stretchable area 42 of the stretchable circuit board 100 with an external device.

In the first exemplary embodiment, only one reinforcement area 40 is provided at a position in the left side portion on the stretchable circuit board 100 as illustrated in FIG. 1 and FIG. 2. However, the configuration is not limited to this, and it may be possible to provide the reinforcement area 40 in plural locations.

On the stretchable circuit board 100, the draw-out wiring portion 54 formed on the main surface 51 of the reinforcement base 50 and the stretchable wiring portion 20 formed on the main surface 11 of the stretchable base 10 are formed on the same layer. Furthermore, an end portion of the draw-out wiring portion 54 and an end portion of the stretchable wiring portion 20 are joined together at the joining portion 56 located on the boundary area between the reinforcement area 40 and the stretchable area 42, whereby the draw-out wiring portion 54 and the stretchable wiring portion 20 are electrically continuous with each other. More specifically, at least one of the end portion of the draw-out wiring portion 54 and the end portion of the stretchable wiring portion 20 has a fusing property, and this end portion is brought into close contact with the other end portion through heating and/or application of pressure, whereby these end portions are directly joined together. As described later, it is preferable that both of the draw-out wiring portion 54 and the stretchable wiring portion 20 contain an elastomer material as a resin binder, and both of the draw-out wiring portion 54 and the stretchable wiring portion 20 are melted and integrally fused through heating and/or application of pressure.

Figure 3A:
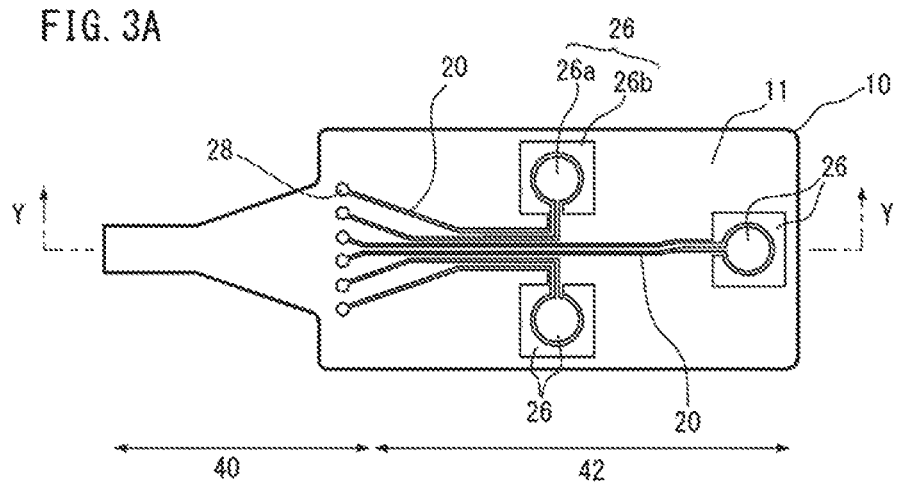
FIG. 3A is a plan view illustrating a stretchable base.
Figure 3B:
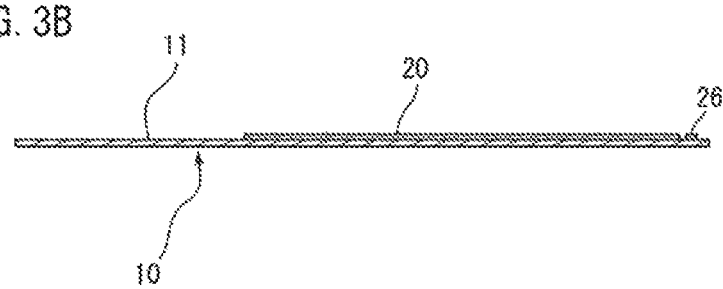
FIG. 3B is a sectional view taken along the line Y-Y in FIG. 3A.

FIG. 3A is a plan view illustrating the stretchable base 10 as viewed from the upper surface side (top side in FIG. 2), and FIG. 3B is a sectional view taken along the line Y-Y in FIG. 3A. The stretchable base 10 is a sheet-shaped member that can stretch at least in one direction of in-plane directions. It is desirable that the stretchable base 10 can stretch in two directions of the in-plane directions. The stretchable base 10 may have isotropic stretchability in in-plane directions, or may have anisotropic stretchability in in-plane directions so that the stretchable base 10 stretches differently in different directions in plane.

The stretchable wiring portion 20 is a stretchable electroconductive pattern that is a pattern formed on one side or both sides of the stretchable base 10. In the first exemplary embodiment, the stretchable wiring portion 20 is formed on a surface (the main surface 11) of one side of the stretchable base 10. The shape of pattern of the stretchable wiring portion 20 is not particularly limited. The first exemplary embodiment illustrated in FIG. 3A gives one mode as an example in which plural line-shaped stretchable wiring portions 20 are formed on the main surface 11 through printing. Each of the stretchable wiring portions 20 has one end having a wiring terminal portion 28, which forms the joining portion 56 (see FIG. 1 and FIG. 2), formed thereon, and the other end having a first electrode 26a or a second electrode 26b, each of which forms the electrode portion 26, formed thereon.

The wiring terminal portion 28 is joined with a wiring terminal portion 58 (see FIG. 4A) of the draw-out wiring portion 54, which will be described later, to form the joining portion 56 (see FIG. 1 and FIG. 2), and is a portion formed so as to have a width wider than that of the stretchable wiring portion 20. The first exemplary embodiment gives one mode as an example in which the stretchable wiring portion 20 terminates at the wiring terminal portion 28. However, the shape and the position of the wiring terminal portion 28 are not limited to those described above, and it may be possible to dispose the wiring terminal portion 28 in a middle portion of the stretchable wiring portion 20.

The wiring terminal portion 28 and the electrode portion 26 may have stretchability as in the case of the stretchable wiring portion 20, or they may be configured such that in-plane rigidity thereof is higher than that of the stretchable wiring portion 20 and they substantially do not have stretchability. However, as will described later, it is preferable that the wiring terminal portion 28 and the electrode portion 26 are made from the same electrically conductive material as the stretchable wiring portion 20, and are formed using printing through the same processes as the stretchable wiring portion 20.

The first exemplary embodiment gives one mode as an example in which the first electrode 26a and the second electrode 26b are disposed so as to be adjacent to each other to form a paired electrode portion 26 (electrode pair). The stretchable circuit board 100 functions as a capacitive proximity sensor that detects occurrence of capacitive coupling due to approach of an electroconductive body such as a hand or finger of a human toward the electrode portion 26 through measurement of capacitance between the first electrode 26a and the second electrode 26b. Alternatively, the stretchable circuit board 100 functions as a touch sensor that detects contact of an electroconductive body such as a hand or finger of a human over the first electrode 26a and the second electrode 26b through measurement of electric resistance between the first electrode 26a and the second electrode 26b. However, the present invention is not limited to this. It may be possible to separately arrange plural electrode portions 26 in a spreading manner. Furthermore, it may be possible to use the electrode portion 26 as sensing electrodes for measuring weak electric voltage such as myoelectric potential. FIG. 3A illustrates, as an example, the stretchable base 10 including three paired electrode portions 26. However, the number of electrode portions 26 can be freely selected. Alternatively, it may be possible to employ a configuration in which no electrode portion 26 is provided, and only the stretchable wiring portion 20 is formed on the stretchable base 10. In this case, the stretchable circuit board 100 can be used as a circuit board for transmitting electrical signals.

The electrode portion 26 is formed in the stretchable area 42, and the wiring terminal portion 28 is formed in the reinforcement area 40. Furthermore, the stretchable wiring portion 20 is formed so as to extend over the stretchable area 42 and the reinforcement area 40.

The stretchable base 10 has stretchability, and stretches in in-plane directions due to application of external force. The stretchable base 10 includes one layer, or a layered body including plural layers each having stretchability.

A preferable base material forming the stretchable base 10 includes an elastomer material such as nitrile rubber, latex rubber, urethane-based elastomer, and silicone-based elastomer. However, the base material is not limited to this. In particular, by employing a urethane-based elastomer sheet used in medical application, it is possible to enhance safety in the case where it is attached on a skin of a human body.

No particular limitation is applied to the thickness of the stretchable base 10. However, from the viewpoint of avoiding restriction on stretching movements of the target object (target surface) to which the stretchable circuit board 100 is applied, it is preferable that the stretchable base 10 has a thickness, for example, of not more than 100 μm. More desirably, the thickness of the stretchable base 10 is not more than 25 μm, and still more desirably, is not more than 10 μm.

It is preferable that the stretchable base 10 has the maximum elongation percentage of not less than 10%, more preferably, of not less than 50%, still more preferably, of not less than 100%, and still more preferably, of not less than 200%. If the stretchable base 10 is made from the base material described above, it is possible to achieve the maximum elongation percentage, for example, of not less than 300%. Here, the maximum elongation percentage of the stretchable base 10 represents the maximum value of percentage of elongation of the stretchable base 10 elastically deformable in one direction in in-plane directions.

It should be noted that the elongation percentage as used in this specification represents a ratio of elongation in one direction in in-plane directions caused by application of external force relative to the size in the case where no external force is applied (size at the time of elongation percentage of 0%). For example, in the case of the elongation percentage of 50%, the size is 1.5 times the size at the time of the elongation percentage of 0%. In the case of the elongation percentage of 100%, the size is twice the size at the time of elongation percentage of 0%.

The stretchable wiring portion 20 is configured to contain an electrically conductive material, and has electrical conductivity. The electrically conductive material described above may include silver, gold, platinum, carbon, copper, aluminum, cobalt, and nickel, or it may be possible to select an alloy thereof or other materials having preferable electrical conductivity. The shape of the electrically conductive material is not particularly limited. However, it may be possible to use a particle-like shape such as a granule and powder. There is no particular limitation to the shape of the particle. However, it may be possible to use a spherical shape, a needle shape, a flake shape, a nanowire shape, or the like. The aspect ratio of the particle may be set, for example, to be not less than 1 and not more than 100, and in particular, be not less than 1 and not more than 50. Here, the aspect ratio means a ratio of the longest dimension of a three-dimensional body relative to the shortest dimension. By setting the aspect ratio of particles constituting the stretchable wiring portion 20 to be not less than 5 and not more than 20, it is possible to reduce a change in resistance in the case where the stretchable circuit board 100 stretches in in-plane directions and the stretchable wiring portion 20 deforms in the longitudinal direction.

It is preferable that the stretchable wiring portion 20 further contains a resin binder. More specifically, the stretchable wiring portion 20 according to the first exemplary embodiment is made from an electrically conductive material prepared in a manner such that electrically conductive particles are dispersed in a resin material. Since the stretchable wiring portion 20 contains a resin binder, it is possible to prevent the stretchable wiring portion 20 from breaking due to stretching of the stretchable base 10. The resin binder includes, for example, a thermoplastic elastomer material such as an urethane resin binder and silicone rubber. However, the resin binder is not limited to this. It is desirable to select a resin binder having reduced Young's modulus so that the elastic modulus of the stretchable wiring portion 20 in a filmed state is less than or equal to that of the stretchable base 10. One type of elastomer material may be used for the resin binder, or plural types of elastomer materials may be mixed and be used.

By using thermoplastic resin as the resin binder for the stretchable wiring portion 20, it is possible to mechanically and electrically connect wires of the stretchable wiring portion 20 and the draw-out wiring portion 54 with a fusing property that the stretchable wiring portion 20 has, at the time of joining the stretchable wiring portion 20 and the draw-out wiring portion 54 together. This configuration eliminates the need of using a joining member such as an anisotropic conductive film (ACF) to join the stretchable wiring portion 20 and the draw-out wiring portion 54 together, simplifying this joining step.

There is no particular limitation to the method of forming the stretchable wiring portion 20. However, the stretchable wiring portion 20 can be formed, for example, through a printing method. In other words, the stretchable wiring portion 20 according to the first exemplary embodiment is a printed pattern formed by printing and applying an electroconductive paste having stretchability.

There is no particular limitation to the printing method. However, examples thereof may include, for example, a screen printing method, an inkjet printing method, a gravure printing method, and an offset printing method. Of these methods, screen printing is preferably used from the viewpoint of fine resolution or stability in thick membrane.

In the case where the stretchable wiring portion 20 is formed through the printing method, it is preferable to blend the electrically conductive particle described above, a resin binder, and an electroconductive paste containing organic solvent, and use the blended one in the printing method. By using a stretchable electroconductive paste containing metal particle such as silver as the primary component to form the stretchable wiring portion 20, it is possible to achieve the elongation percentage, for example, of approximately not less than 50% and not more than 70%, and also form a circuit exhibiting an excellent stretching property.

In addition, it is preferable to print and form the wiring terminal portion 28 and the electrode portion 26 (the first electrode 26a and the second electrode 26b) using the same electroconductive paste as that of the stretchable wiring portion 20 through the same process as the stretchable wiring portion 20. This enables the electrode portion 26 to have an excellent stretching property, and makes it possible to obtain the stretchable circuit board 100 through the minimum processes.

The thickness size and the width size of the stretchable wiring portion 20 may be determined on the basis of resistivity of the stretchable wiring portion 20 at no load, a change in resistance of the stretchable base 10 when it is stretched, and restriction on the thickness size and the width size of the stretchable circuit board 100 as a whole. From the viewpoint of causing the stretchable wiring portion 20 to follow changes in size of the stretchable base 10 at the time of stretching, and thereby achieving favorable stretchability, the width size of the stretchable wiring portion 20 is set preferably to not more than 1000 µm, more preferably to not more than 500 µm, still more preferably to not more than 200 µm. The thickness size of each wire constituting the stretchable wiring portion 20 may be set to be not more than 25 µmm, and be set desirably to be not less than 10 µm and not more than 15 µm.

Figure 4A:
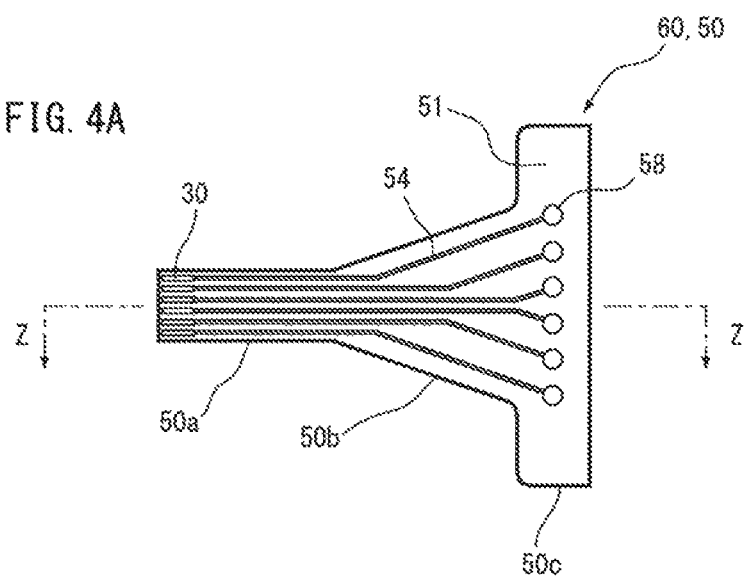
FIG. 4A is a plan view illustrating a reinforcement base.
Figure 4B:
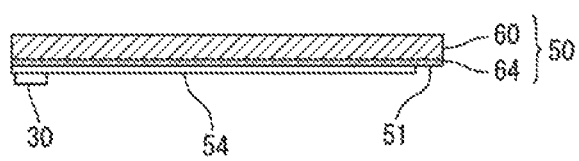
FIG. 4B is a sectional view taken along the line Z-Z in FIG. 4A.

FIG. 4A is a plan view (bottom view) illustrating the reinforcement base 50 as viewed from the lower surface side (from the bottom side in FIG. 2), and FIG. 4B is a sectional view taken along the line Z-Z in FIG. 4A.

The reinforcement base 50 is a member having in-plane rigidity higher than that of the stretchable base 10 and constituting the reinforcement area 40 of the stretchable circuit board 100. The reinforcement base 50 has the lower surface side, which serves as the main surface 51, and the draw-out wiring portion 54 is formed on this lower surface side.

The reinforcement base 50 has a film base 60 having in-plane rigidity higher than that of the stretchable base 10. The reinforcement base 50 may be configured as a single layer of the film base 60, or may be obtained by layering the film base 60 and another layer (for example, an adhesive enhancing layer 64 that will be described later).

The film base 60 has Young's modulus higher than that of the stretchable base 10. There is no particular limitation to the material of the film base 60. However, it may be possible to use a synthetic resin having a low sliding resistance property, corrosion resistance, and increased strength, such as polyethylene terephthalate (PET), polyethylene naphthalate (PEN), polyimide (PI), polyphenylene sulfide (PPS), and fluorocarbon resin. In addition, for the film base 60, it may be possible to use a paper base material having appropriate durability such as a cellulose nanofibers paper.

In the case where an urethane-based elastomer sheet is used as the stretchable base 10, the sheet has a heat-fusing property, and hence, through heating and compression bonding, the stretchable base 10 can be layered integrally with the film base 60, which is to be bonded with. By directly joining the stretchable base 10 and the film base 60 together, it is possible to omit a joining member such as an ACF, whereby it is possible to simplify the joining processes. In addition, since the stretchable base 10 does not adhere to the film base 60 unless application of heating and/or application of pressure, it is possible to achieve an advantage of providing extremely high workability even in the case where positioning is performed in a highly precise manner. Note that, in this specification, "two layers being directly joined" means that these two layers are brought into direct contact with each other and are made into a single piece through a joining method such as heat pressing (thermal compression bonding).

However, in place of the first exemplary embodiment, it may be possible to use an adhesive or pressure-sensitive adhesive to join the stretchable base 10 and the reinforcement base 50 together. In this case, it is preferable to use an adhesive or pressure-sensitive adhesive to join together an area of the reinforcement base 50 where the wiring terminal portion 58 of the draw-out wiring portion 54 is not formed and an area of the stretchable base 10 where the wiring terminal portion 28 of the stretchable wiring portion 20 is not formed.

The thickness of the film base 60 may be set to be not less than 10 µm and not more than 200 µm, desirably to be not less than 25 µm and not more than 150 µm, and more desirably to be not less than 50 µm and not more than 100 µm. Furthermore, it is preferable that the thickness of the film base 60 is larger than that of the stretchable base 10. By setting the thickness of the film base 60 so as to fall in the range described above, it is possible to sufficiently increase in-plane rigidity of the reinforcement area 40, and reduce the entire thickness of the stretchable circuit board 100.

The draw-out wiring portion 54 formed on the main surface 51 of the reinforcement base 50 may have stretchability or may not have stretchability. The draw-out wiring portion 54 can be manufactured through various types of methods, and it may be possible to use an etching method or printing method as an example. In the case of the etching method, the surface (main surface 51) of the film base 60 is coated with a thin metallic membrane, or a foil material formed into a sheet shape in advance is attached on a base layer. Then, the thin membrane or foil material is etched into a pattern shape of a desired draw-out wiring portion 54, so that the draw-out wiring portion 54 can be manufactured. The thin metallic membrane or foil material includes, for example, copper, nickel, silver, aluminum, and so on.

In the case where the thin metallic membrane or foil material is etched to manufacture the draw-out wiring portion 54, this draw-out wiring portion 54 substantially does not have a fusing property. Thus, the end portion of the draw-out wiring portion 54 and the end portion of the stretchable wiring portion 20 are joined together at the joining portion 56 with the fusing property of the stretchable wiring portion 20 containing an elastomer material as a resin binder.

In the case where the draw-out wiring portion 54 is manufactured through a printing method, it may be possible to form the draw-out wiring portion 54 by applying an electroconductive paste on the surface (main surface 51) of the film base 60 so as to have a desired pattern shape through a method such as a screen printing method, an inkjet printing method, a gravure printing method, and an offset printing method. In this case, the draw-out wiring portion 54 may be manufactured using the same type of electroconductive paste as that used in the case where the stretchable wiring portion 20 is formed through printing. More specifically, in the stretchable circuit board 100, the stretchable wiring portion 20 and the draw-out wiring portion 54 are made from an electrically conductive material prepared in a manner such that electrically conductive particles are dispersed in a resin material, and the electrically conductive material forming the stretchable wiring portion 20 and the electrically conductive material forming the draw-out wiring portion 54 may belong to the same type of resin material. Here, "belonging to the same type of resin material (resin binder)" means that the primary component of the resin material belongs to the same resin category. In other words, it may be possible to use a thermoplastic elastomer material as a resin binder for the draw-out wiring portion 54.

In the case where both of the stretchable wiring portion 20 and the draw-out wiring portion 54 are manufactured by applying an electroconductive paste containing a thermoplastic resin binder through printing, not only the stretchable wiring portion 20 but also the draw-out wiring portion 54 has a fusing property. With this configuration, by overlaying the end portion of the stretchable wiring portion 20 and the end portion of the draw-out wiring portion 54, and heating them and/or applying pressure to them, the resin binder and the electrically conductive particles are integrally fused at the joining portion 56, whereby occurrence of interface resistance can be avoided at the joining portion 56. Furthermore, by directly joining together the stretchable base 10 and the film base 60 through heat pressing as described above, it is possible to simplify the joining processes. Thus, by applying heat pressing to the reinforcement base 50 and the stretchable base 10 in a state where the end portion of the draw-out wiring portion 54 and the end portion of the stretchable wiring portion 20 are overlaid to each other, it is possible to join these wires and these bases into one through the same process. For the reason described above, in the stretchable circuit board 100 according to the first exemplary embodiment, it is preferable that the main surface 11 of the stretchable base 10 and the main surface 51 of the reinforcement base 50 are directly joined together, and a part of the stretchable wiring portion 20 and a part of the draw-out wiring portion 54 (wiring terminal portions 28 and 58) are integrally fused to form the joining portion 56.

However, in place of the first exemplary embodiment, it may be possible to use a thermosetting resin as a resin binder in the electroconductive paste for forming the draw-out wiring portion 54. In this case, the formed draw-out wiring portion 54 substantially does not have a fusing property. However, with the fusing property that the stretchable wiring portion 20 has, the end portion of the draw-out wiring portion 54 and the end portion of the stretchable wiring portion 20 are joined together at the joining portion 56.

Here, in the case where a resin material having a low sliding resistance property such as PET, PEN, and PI is used for the film base 60, and the draw-out wiring portion 54 is formed through a printing method, it is preferable to layer another layer having wettability higher than that of the film base 60 onto the surface of the film base 60, and then, apply an electroconductive paste onto this another layer by printing, rather than directly applying an electroconductive paste onto the surface of the film base 60. This enables the resolution of the draw-out wiring portion 54 to increase.

The reinforcement base 50 according to the first exemplary embodiment has an adhesive enhancing layer 64 layered on the film base 60 as illustrated in FIG. 4B. More specifically, by using the surface of the adhesive enhancing layer 64 having favorable wettability as the main surface 51 of the reinforcement base 50, rather than using the surface of the film base 60 having a low sliding resistance property, it is possible to obtain a favorable coating property for ink (electroconductive paste) to be used for forming the draw-out wiring portion 54 by printing. A surface (lower surface in FIG. 4B) of the adhesive enhancing layer 64 located on a side opposite to the film base 60 serves as the main surface 51 of the reinforcement base 50, and has the draw-out wiring portion 54 formed thereon. It is preferable that hydrophilic treatment such as corona treatment or surface treatment such as surface roughening treatment is applied to a surface of the reinforcement base 50 where the adhesive enhancing layer 64 is layered, to improve an adhesive property with the adhesive enhancing layer 64. This enables the film base 60 and the adhesive enhancing layer 64 to more firmly adhere to each other, and makes it possible to favorably and integrally join the adhesive enhancing layer 64 and the stretchable base 10 together. Thus, as compared with the case where the stretchable base 10 is directly joined with the surface of the film base 60, it is possible to improve joining strength between the film base 60 and the stretchable base 10.

The adhesive enhancing layer 64 is a layer characterized in that the layer 64 has wettability higher than that of the film base 60, and the adhesion force between the adhesive enhancing layer 64 and the stretchable base 10 is higher than that between the film base 60 and the stretchable base 10.

As for the material of the adhesive enhancing layer 64, it may be possible to use the same type of elastomer material as that of the stretchable base 10. There is no particular limitation to the thickness of the adhesive enhancing layer 64. However, by forming the adhesive enhancing layer 64 so as to have the thickness thinner than that of the stretchable base 10, it is possible to reduce the entire thickness size of the stretchable circuit board 100. In addition, it may be possible to use, for the adhesive enhancing layer 64, an elastomer material, a primer paint (primer), an adhesive or other thermoplastic resin that is different from that of the stretchable base 10. By using thermoplastic resin for the stretchable base 10 and the adhesive enhancing layer 64, it is possible to directly join the stretchable base 10 and the adhesive enhancing layer 64 together, for example, through heat pressing.

The draw-out wiring portion 54 has one end having the terminal portion 30 formed thereon, and the other end having the wiring terminal portion 58 formed thereon. The wiring terminal portion 58 is a portion that is joined with the wiring terminal portion 28 (see FIG. 3A) of the stretchable wiring portion 20 to form the joining portion 56 (see FIG. 1 and FIG. 2), and is formed so as to have a thickness thicker than that of the draw-out wiring portion 54. The first exemplary embodiment gives one mode as an example in which the draw-out wiring portion 54 terminates at the wiring terminal portion 58. However, the position and the shape of the wiring terminal portion 58 are not limited to those described above.

The terminal portion 30 is configured as a connector that is inserted into or removed from an external device (not illustrated). The first exemplary embodiment gives one mode as an example in which the terminal portion 30 is layered and formed on the surface (lower surface side in this drawing) of the draw-out wiring portion 54 as illustrated in FIG. 4B. However, the configuration is not limited to this. It may be possible to form the terminal portion 30 on the main surface 51 of the reinforcement base 50, and form the draw-out wiring portion 54 so as to extend over this terminal portion 30 to electrically and mechanically connect the terminal portion 30 with the draw-out wiring portion 54. The terminal portion 30 is provided separately for each of the plural draw-out wiring portions 54.

There is no particular limitation to the thickness of the terminal portion 30. However, it may be possible to set the thickness of the terminal portion 30 to be not less than 5 μm and not more than 40 μm. By setting the thickness of the terminal portion 30 to be not less than 5 μm, it is possible to achieve favorable durability in the case where the terminal portion 30 is repeatedly inserted into or removed from the external device. Furthermore, by setting the thickness of the terminal portion 30 to be not more than 40 μm, it is possible to reduce the thickness of the reinforcement area 40, thereby achieving flexibility.

The main surface 51 of the reinforcement base 50 is provided with the terminal portion 30, and the terminal portion 30 is connected with the draw-out wiring portion 54. The terminal portion 30 is made from a material different from that of the draw-out wiring portion 54. More specifically, the terminal portion 30 is made from a material having wear resistance higher than that of the draw-out wiring portion 54.

In the case where the draw-out wiring portion 54 is manufactured through an etching method, the terminal portion 30 can be obtained by forming a plating film on a thin metallic membrane or on the surface of the foil material, each of which forms the draw-out wiring portion 54. More specifically, in the case where the draw-out wiring portion 54 is manufactured by etching a thin membrane or foil material made from copper or nickel, the terminal portion 30 can be manufactured by forming a plating film such as gold plating, nickel-gold plating, and solder plating on the end portion of the draw-out wiring portion 54, in other words, by placing a metal layer on a part of the draw-out wiring portion 54.

Furthermore, in the case where the draw-out wiring portion 54 is manufactured through a printing method, the terminal portion 30 can be manufactured by overlaying an electrically conductive coat having wear resistance such as a carbon paste, on the end portion of the draw-out wiring portion 54 formed by printing. Since the carbon paste employs carbon, which is non-metal, as electrically conductive particles, reduction in ion migration or improvement in wear resistance can be expected. Furthermore, in place of the first exemplary embodiment, it may be possible to manufacture the terminal portion 30 and the draw-out wiring portion 54 using the same type of material. In this case, it may be possible to integrally form the terminal portion 30 and the draw-out wiring portion 54 using the electroconductive paste or carbon paste described above through the same process.

As illustrated in FIG. 4A, the reinforcement base 50 according to the first exemplary embodiment includes a band-shaped portion 50a that has a narrow width and forms a cable portion, a wide width portion 50c that has a width wider than that of this band-shaped portion 50a, and a width increasing portion 50b that has a width size (the size in the top-bottom direction of FIG. 4A) increasing from the band-shaped portion 50a toward the wide width portion 50c. The terminal portion 30 is disposed in the band-shaped portion 50a, and the wiring terminal portion 58 is disposed in the wide width portion 50c. The draw-out wiring portion 54 is patterned in a manner such that draw-out wiring portions 54 are formed in parallel in the band-shaped portion 50a, and radially expand in the width increasing portion 50b.

The width size of the wide width portion 50c is equal to that of the stretchable base 10 illustrated in FIG. 3A. With this configuration, by overlaying the reinforcement base 50 and the stretchable base 10 as illustrated in FIG. 1 and FIG. 2, the stretchable base 10 can maintain stability in shape throughout the width direction of the stretchable circuit board 100 according to the first exemplary embodiment, whereby favorable handleability can be achieved.

As illustrated in FIG. 3A, the reinforcement area 40 of the stretchable base 10 has substantially the same shape as the reinforcement base 50. The reinforcement base 50 is overlaid so that the main surface 51 having the draw-out wiring portion 54 formed thereon faces the reinforcement area 40 on the main surface 11, having the stretchable wiring portion 20 formed thereon, of the stretchable base 10. With this configuration, substantially the entire main surface 51 of the reinforcement base 50 is layered on the stretchable base 10.

Figure 5:
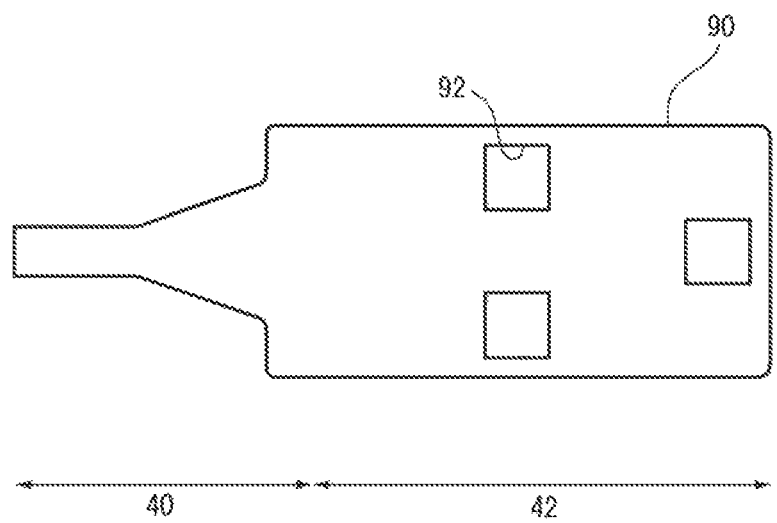
FIG. 5 is a plan view illustrating a protection layer.

FIG. 5 is a plan view illustrating a protection layer 90. The protection layer 90 is a sheet-shaped cover that has stretchability and covers a surface where the stretchable wiring portion 20, which is formed on the main surface 11 of the stretchable base 10, is formed (see FIG. 2). The protection layer 90 according to the first exemplary embodiment is formed so as to have a size that not only extends over the stretchable area 42 but also reaches the reinforcement area 40, and covers the upper surface (a surface opposite to the main surface 51) of the reinforcement base 50 as illustrated in FIG. 2.

The protection layer 90 has openings 92 at positions corresponding to the electrode portions 26 as illustrated in FIG. 1. With this configuration, the electrode portions 26, which are formed on the main surface 11 of the stretchable base 10, are exposed from the openings 92 in a state where the protection layer 90 is layered on the stretchable base 10. The protection layer 90 according to the first exemplary embodiment is configured to cover the entire upper surface side of the stretchable circuit board 100 except for the openings 92. In other words, the whole of the reinforcement base 50 is covered by the protection layer 90. With this configuration, the protection layer 90 functions as a cover that not only protects the stretchable wiring portion 20 but also protects the draw-out wiring portion 54 and the terminal portion 30. However, in place of the first exemplary embodiment, the protection layer 90 may be formed so as to cover only the stretchable area 42 and the wide width portion 50c (see FIG. 4A) of the reinforcement base 50.

With the protection layer 90 being provided, it is possible to cause the entire stretchable base 10 to stretch in a relatively uniform manner in the case where the stretchable circuit board 100 is stretched in in-plane directions, and also to prevent the stretchable wiring portion 20 from breaking. Furthermore, since the protection layer 90 is formed so as to extend over the stretchable area 42 and the reinforcement area 40, the stress concentration occurring on the end edge of the protection layer 90 is distributed by the reinforcement area 40, and hence, it is possible to further prevent the stretchable wiring portion 20 from breaking. In addition, since the stretchable wiring portion 20 is sandwiched in the thickness direction between the protection layer 90 and the stretchable base 10, the stretchable wiring portion 20 is positioned substantially at the center of the stretchable circuit board 100 in the thickness direction in the stretchable area 42. Thus, when the stretchable circuit board 100 is folded or bent in the surface-normal direction, the tensile stress and the compressive stress acting on the stretchable wiring portion 20 are cancelled, so that the stretchable wiring portion 20 can be protected.

It is preferable that the protection layer 90 is made from an insulating material having stretchability. For example, an elastomer material may be used for the protection layer 90, and it may be possible to use the same resin material as the stretchable base 10. With this configuration, it is possible to protect the stretchable wiring portion 20 without deteriorating stretchability of the stretchable area 42 on the stretchable circuit board 100. The protection layer 90 can be manufactured by applying an elastomer based paste to the film base 60 and the stretchable base 10 and drying them. Alternatively, it may be possible to affix a protection layer 90 formed into a sheet shape in advance and having openings 92 formed thereon, to the film base 60 and the stretchable base 10, or it may be possible to join them using an adhesive.

There is not particular limitation to the thickness of the protection layer 90. However, the thickness of the protection layer 90 is set preferably to not more than 100 μm, more preferably to not more than 50 μm, and still more preferably to not more than 30 μm from the viewpoint of avoiding restriction to stretchability of the stretchable circuit board 100.

Returning to FIG. 1 and FIG. 2, the stretchable circuit board 100 according to the first exemplary embodiment has a stretchable supporting member 96. The stretchable supporting member 96 is provided so as to extend over the reinforcement area 40 and the stretchable area 42. More specifically, the stretchable supporting member 96 is provided throughout the entire width of the stretchable circuit board 100 and in an area containing the joining portion 56 between the stretchable wiring portion 20 and the draw-out wiring portion 54.

The stretchable supporting member 96 has stretchability in in-plane directions, and may be made from the same type of elastomer material as the stretchable base 10 and the protection layer 90. The first exemplary embodiment gives one mode as an example in which the stretchable supporting member 96 is bonded to the upper surface of the protection layer 90, in other words, to a surface opposite to the stretchable base 10 with respect to the protection layer 90. However, the configuration is not limited to this. The stretchable supporting member 96 may be bonded to the lower surface (a surface opposite to the main surface 11) of the stretchable base 10.

As for a method for bonding the stretchable supporting member 96 to the protection layer 90 or the stretchable base 10, it may be possible to use a fusing method through heating, or it may be possible to join them through an adhesive having stretchability or pressure-sensitive adhesive (not illustrated).

With the stretchable supporting member 96 being provided as described in the first exemplary embodiment, it is possible to distribute stress that can be concentrated on the boundary with the reinforcement area 40 in the case where the stretchable area 42 of the stretchable circuit board 100 is stretched, whereby it is possible to reduce the risk of breakage of the stretchable wiring portion 20.

A reinforcing member 94 is provided in an area (distal end portion) in the reinforcement area 40 where the terminal portion 30 is formed. The reinforcing member 94 is a spacer member for adjusting the thickness of the distal end portion of the reinforcement base 50 so as to have the accuracy set, for example, for a connector (not illustrated) of an external device when the terminal portion 30 is fitted, for example, to this connector and is connected with this external device.

As for a material for forming the reinforcing member 94, it may be possible to use a synthetic resin having a low sliding resistance property, corrosion resistance, and increased strength, such as PET, PEN, and PI, or it may be possible to use a paper base material. The reinforcing member 94 may be made from the same type of material as the film base 60, or may be made from a material that belongs to a different type from a material type for the film base 60. In addition, a thin sheet-like metal plate may be used as the reinforcing member 94. The reinforcing member 94 is provided on a side opposite to the terminal portion 30 with respect to the reinforcement base 50. When the reinforcing member 94 is joined with the reinforcement base 50 (film base 60), it may be possible to use a general pressure-sensitive adhesive or adhesive.

Figure 6:
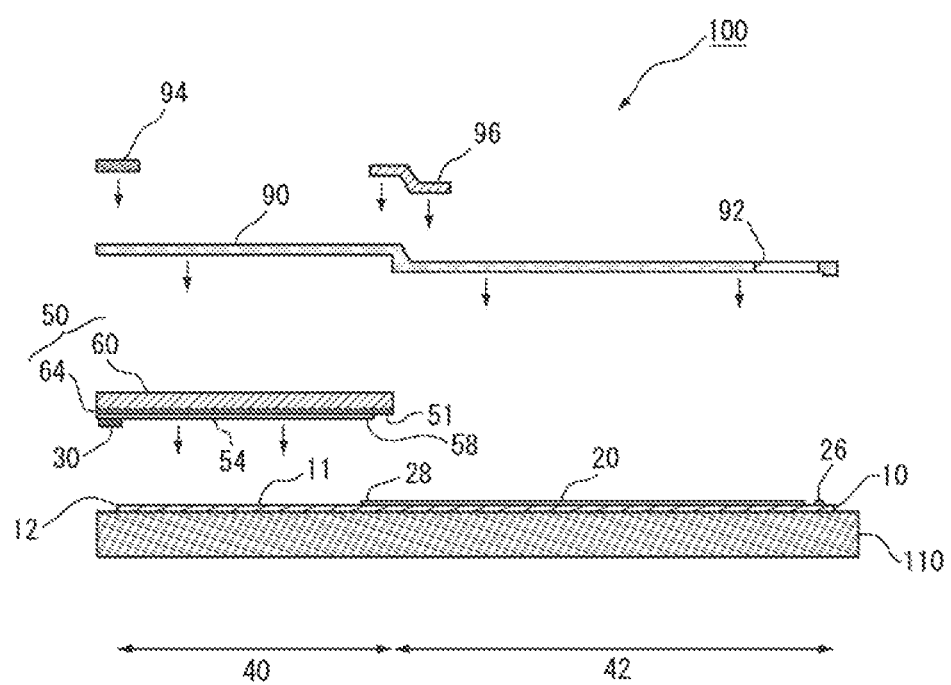
FIG. 6 is a schematic view illustrating manufacturing processes for the stretchable circuit board.

A method (hereinafter, referred to as the present method) for manufacturing the stretchable circuit board 100 according to the first exemplary embodiment will be described. FIG. 6 is a schematic view illustrating manufacturing processes for the stretchable circuit board 100. FIG. 7A is an enlarged diagram illustrating a mode in which the stretchable wiring portion 20 and the draw-out wiring portion 54 are joined together, and FIG. 7B is an enlarged diagram illustrating the joining portion 56.

The present method at least includes a stretchable wiring forming step, a draw-out line forming step, and a joining step. The order as to which of the stretchable wiring forming step and the draw-out line forming step is performed first may be freely determined.

In the stretchable wiring forming step, the stretchable wiring portion 20 having stretchability is formed on the main surface 11, which is located on at least one side of the stretchable base 10. In the draw-out line forming step, the draw-out wiring portion 54 is formed on the main surface 51 located on at least one side of the reinforcement base 50 having in-plane rigidity higher than that of the stretchable base 10. In addition, in the joining step, the main surface 51 of the reinforcement base 50 is overlaid with a part of an area where the stretchable wiring portion 20 is formed, in a manner such that the main surface 51 of the reinforcement base 50 faces the main surface 11 of the stretchable base 10, and a part of the stretchable wiring portion 20 and a part of the draw-out wiring portion 54 are joined together, and are electrically continuous with each other.

Next, the present method will be described in detail.

In the stretchable wiring forming step, the stretchable base 10 is prepared, and an electroconductive paste is applied to the main surface 11 of this stretchable base 10 through a printing method to form the stretchable wiring portion 20, the wiring terminal portion 28, and the electrode portion 26. In order to enhance handleability of the stretchable base 10 having stretchability, it is preferable to attach a separator 110 made, for example, from a paper material on the lower surface (a surface opposite to the main surface 11) of the stretchable base 10. It is preferable to detach the separator 110 from the stretchable base 10 when the stretchable circuit board 100 is used.

In the draw-out line forming step, the film base 60 is prepared, the adhesive enhancing layer 64 is optionally layered and formed, and then, the draw-out wiring portion 54 and the wiring terminal portion 58 are formed. In the case where the draw-out wiring portion 54 is formed through a printing method, it is preferable that the adhesive enhancing layer 64 is formed on one side of the film base 60, and an electroconductive paste is applied on the adhesive enhancing layer 64 through a printing method to form the draw-out wiring portion 54 and the wiring terminal portion 58. Next, the terminal portion 30 is formed, through a method such as printing of a carbon paste, on the end portion (distal end portion) of the formed draw-out wiring portion 54 located on a side opposite to the wiring terminal portion 58. With these steps, the reinforcement base 50 is completed. Note that, in place of the steps described above, it may be possible to form the terminal portion 30 using a carbon paste, prior to formation of the draw-out wiring portion 54. More specifically, it is preferable that the terminal portion 30 is formed on the reinforcement base 50 (adhesive enhancing layer 64) by printing using a carbon paste, and then, the draw-out wiring portion 54 is formed on the terminal portion 30 in a layered manner by printing using an electroconductive paste.

As illustrated in FIGS. 7A and 7B, in the joining step, the reinforcement base 50 and the stretchable base 10 are first positioned with each other in a state where the main surface 51 of the reinforcement base 50 and the main surface 11 of the stretchable base 10 are faced with each other. Then, the stretchable base 10 and the reinforcement base 50 are heated or pressed to directly join the main surface 11 of the stretchable base 10 and the main surface 51 of the reinforcement base 50 together, and a part of the stretchable wiring portion 20 and a part of the draw-out wiring portion 54 are integrally fused. With this step, the joining portion 56 (see FIG. 7B) at which the wiring terminal portion 28 and the wiring terminal portion 58 are fused is formed, and the stretchable wiring portion 20 and the draw-out wiring portion 54 are electrically continuous with each other. Furthermore, the stretchable base 10 and the reinforcement base 50 are directly attached to each other using an adhesive property of the elastomer material. More specifically, in the present method, the reinforcement base 50 and the stretchable base 10 are heated and pressed to fuse them, and then, are joined together. The heating means may include a laminating method using a heating roll, and heating-pressuring means. Application of pressure and pressing may be performed in an atmospheric condition, or may be performed in a vacuum. With this step, the reinforcement base 50 (the film base 60 or the adhesive enhancing layer 64) is mechanically joined using a thermal fusing property of the stretchable base 10, and the draw-out wiring portion 54 is mechanically and electrically connected using a thermal fusing property of the stretchable wiring portion 20. Thus, it is possible to directly connect between the draw-out wiring portion 54 and the stretchable wiring portion 20 and between the reinforcement base 50 and the stretchable base 10 without using an adhesive or pressure-sensitive adhesive. As a result, the connection work completes in a significantly simplified manner.

As illustrated in FIG. 2 and FIG. 6, the stretchable base 10 is joined with the reinforcement base 50 so as to cover at least a part of the draw-out wiring portion 54. Furthermore, the stretchable base 10 extends to reach the distal end portion of the reinforcement area 40 so as to reach the vicinity of the terminal portion 30, or covers a part of the terminal portion 30. In other words, a part of an end edge 12 of the stretchable base 10 is located closer to the terminal portion 30, than to the stretchable wiring portion 20. As the stretchable base 10 covers the lower surface side of the reinforcement base 50 so as to reach the vicinity of the terminal portion 30 as described above, it is possible to protect the entire draw-out wiring portion 54 by the stretchable base 10.

Then, the protection layer 90 is formed. The protection layer 90 may be formed after the completion of the joining step in which the reinforcement base 50 and the stretchable base 10 are joined together, or may be formed concurrently with the joining step.

The protection layer 90 may be formed by applying an elastomer based paste on the film base 60 and the stretchable base 10, or may be formed by joining a sheet made from elastomer with the film base 60 and the stretchable base 10 through a laminate method using a heating roll, or using heating and pressing. In addition, it may be possible to provide the protection layer 90 with a pressure-sensitive adhesive layer having stretchability, and join the protection layer 90 with the film base 60 and the stretchable base 10 through bonding.

Furthermore, the reinforcing member 94 is prepared, and is joined with the upper surface (a side opposite to the film base 60) of the protection layer 90 through adhesion or pressure-sensitive adhesion. In addition, the stretchable supporting member 96 is prepared, and the stretchable supporting member 96 is joined with the boundary portion between the reinforcement area 40 and the stretchable area 42 so as to cover the joining portion 56 where the wiring terminal portion 28 and the wiring terminal portion 58 are integrally fused. The order as to which of the reinforcing member 94 and the stretchable supporting member 96 is joined first may be freely determined. These joining steps may be performed at the same time.

The contour of the layered body layered as described above is machined, whereby it is possible to obtain the stretchable circuit board 100

Second Exemplary Embodiment

The stretchable circuit board 100 according to the first exemplary embodiment described above has a double-sided structure in which the surface where the electrode portion 26 is exposed and the surface where the terminal portion 30 is exposed are disposed separately on the upper surface and the lower surface of the stretchable circuit board 100, respectively. The stretchable circuit board 200 according to the second exemplary embodiment has a single-sided structure in which both of these surfaces where the electrode portion 26 and the terminal portion 30 are exposed are disposed on one side of the stretchable circuit board 200. Below, the stretchable circuit board 200 according to the second exemplary embodiment of the present invention will be described with focus being placed on things different from the first exemplary embodiment, and details that are the same as the first exemplary embodiment will not be repeated.

Figure 8:
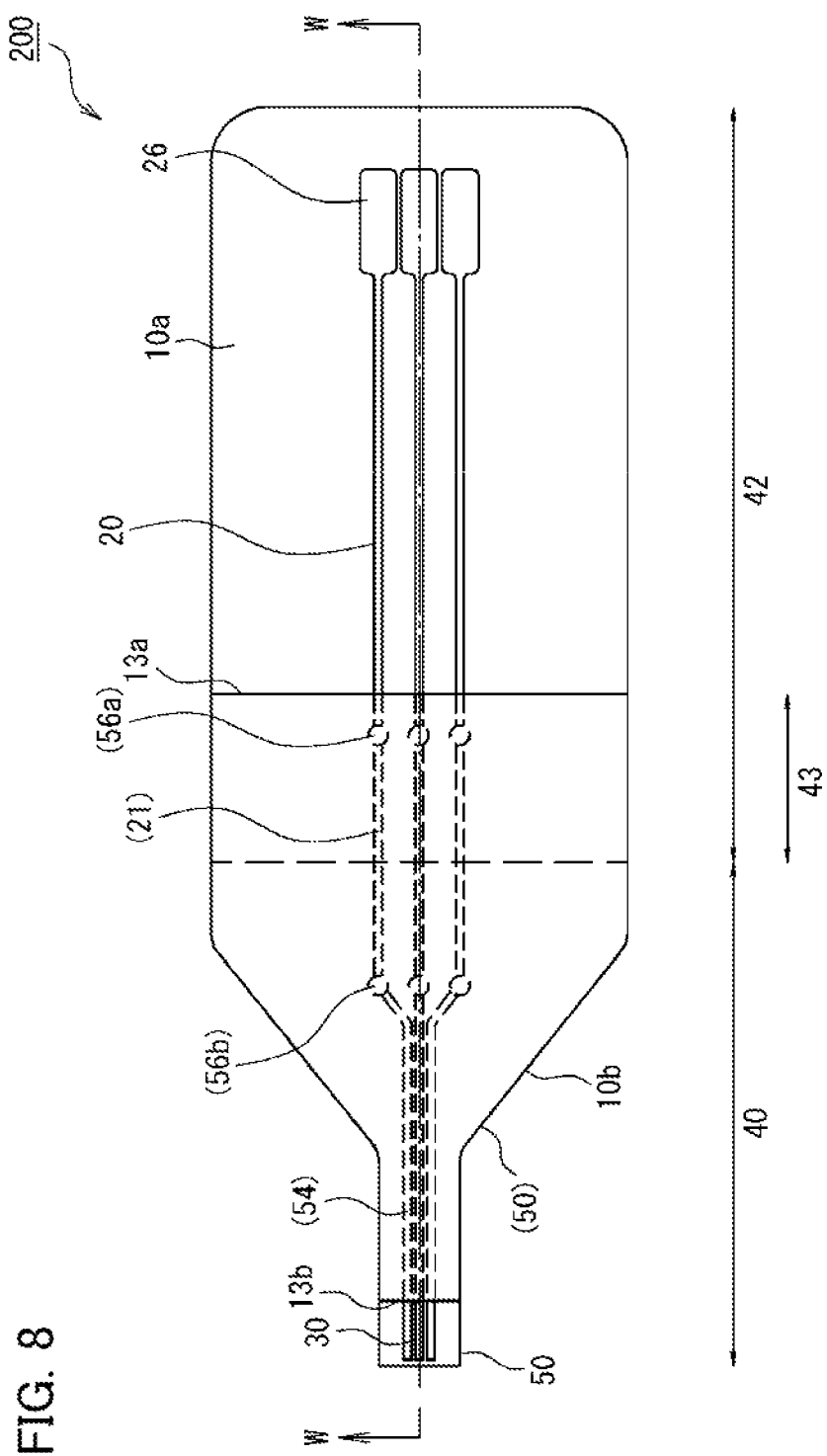
FIG. 8 is a plan view illustrating a stretchable circuit board according to a second exemplary embodiment of the present invention.
Figure 9:
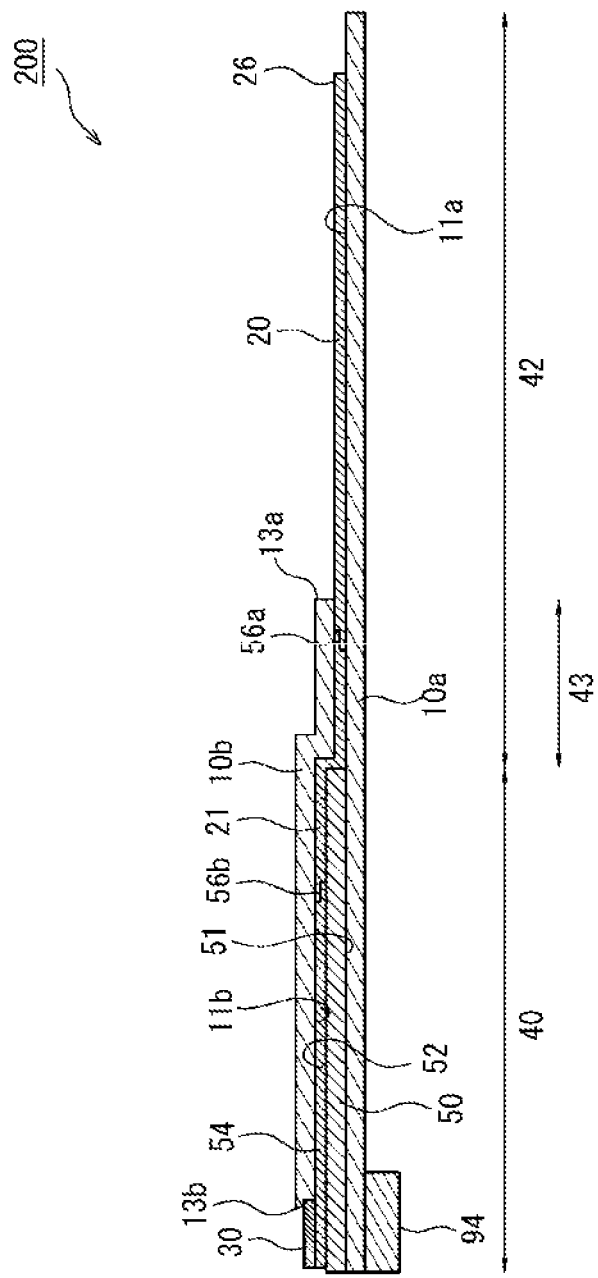
FIG. 9 is a sectional view taken along the line W-W in FIG. 8.

FIG. 8 is a plan view illustrating the stretchable circuit board 200 according to the second exemplary embodiment of the present invention. FIG. 9 is a sectional view taken along the line W-W in FIG. 8. First, the outline of the second exemplary embodiment will be described. For the purpose of convenience, in some cases in the following description, the bottom side in FIG. 9 is called a lower surface side, and the top side in FIG. 9 and the side toward a reader who is looking at FIG. 8 are called an upper surface side. However, these directions are defined for the purpose of convenience with the aim of illustrating relative positional relationships of constituent elements, and do not necessarily match the top or bottom in the gravity direction.

The stretchable circuit board 200 according to the second exemplary embodiment includes: a stretchable base 10a (first stretchable base); a stretchable wiring portion 20 formed on a main surface 11a located on at least one side of the stretchable base 10a; a reinforcement base 50; a draw-out wiring portion 54 formed on a main surface 52 located on at least one side of the reinforcement base 50; a stretchable base 10b (second stretchable base); and a stretchable connecting wiring portion 21 formed on a main surface 11b located on at least one side of the stretchable base 10b. Furthermore, the main surface 11b of the stretchable base 10b faces and is overlaid with the main surface 11a of the stretchable base 10a and the main surface 52 of the reinforcement base 50 located on the side of the draw-out wiring portion 54. In addition, a part of the stretchable wiring portion 20 and a part of the stretchable connecting wiring portion 21 are joined together, and a part of the draw-out wiring portion 54 and a part of the stretchable connecting wiring portion 21 are joined together. With this configuration, the stretchable wiring portion 20 and the draw-out wiring portion 54 are electrically continuous with each other through the stretchable connecting wiring portion 21.

In the example illustrated in FIG. 8 and FIG. 9, the main surface 51 of the reinforcement base 50 located on a side opposite to the draw-out wiring portion 54 and the main surface 11a of the stretchable base 10a are joined together. However, the reinforcement base 50 may not be joined with the stretchable base 10a. For example, a stretchable base, which is different from the stretchable base 10a, may be joined with the main surface 51 of the reinforcement base 50. Even with such a structure, the stretchable base 10b functions as a connection between the reinforcement base 50 and the stretchable base 10a, and hence, it is possible to form the stretchable circuit board 200 that has been integrated.

The stretchable wiring portion 20 formed on the stretchable base 10a has stretchability, and hence, the stretchable circuit board 200 can flexibly follow movements of the body surface of a living body, for example, even in the case where the stretchable circuit board 200 is affixed to the body surface of the living body. Furthermore, the stiffness of the reinforcement base 50 facilitates operations to connect it with an external device through the draw-out wiring portion 54 formed on the reinforcement base 50 having in-plane rigidity higher than that of the stretchable base 10a. In addition, since the stretchable wiring portion 20 and the draw-out wiring portion 54 can be electrically and mechanically connected through the stretchable connecting wiring portion 21, it is possible to prevent breakage of wires at the joining portion, and also achieve stretchable circuit board having high electrical reliability.

The stretchable circuit board 200 according to the second exemplary embodiment includes the stretchable base 10b (second stretchable base), the stretchable connecting wiring portion 21 (stretchable wiring portion), the reinforcement base 50 having in-plane rigidity higher than that of the stretchable base 10b, and the draw-out wiring portion 54. The stretchable connecting wiring portion 21 is formed on the main surface 11b located on at least one side of the stretchable base 10b, and has stretchability. The draw-out wiring portion 54 is formed on the main surface 52 located on at least one side of the reinforcement base 50. The main surface 52 of the reinforcement base 50 is overlaid with a part of an area where the stretchable connecting wiring portion 21 is formed, in a manner such that the main surface 52 of the reinforcement base 50 faces the main surface 11b of the stretchable base 10b. In addition, a part of the stretchable connecting wiring portion 21 and a part of the draw-out wiring portion 54 are joined together, and are electrically continuous with each other.

As described above, the stretchable circuit board 200 according to the second exemplary embodiment has a common structure to the stretchable circuit board 100 according to the first exemplary embodiment, and moreover, can provide a stretchable circuit board having the one-sided structure. Here, the term "reinforcement" of the reinforcement base 50 means partially reinforcing in-plane rigidity of the entire stretchable circuit board 100 or 200 to give stiffness to it, and also means reinforcing in-plane rigidity of part of members constituting the stretchable circuit board 100 or the stretchable circuit board 200.

Next, the stretchable circuit board 200 according to the second exemplary embodiment will be described in detail.

The stretchable circuit board 200 has at least one terminal portion 30 as with the first exemplary embodiment, and is used by connecting the terminal portion 30 with various external devices. The external devices to be connected are similar to those described in the first exemplary embodiment.

Figure 10A:
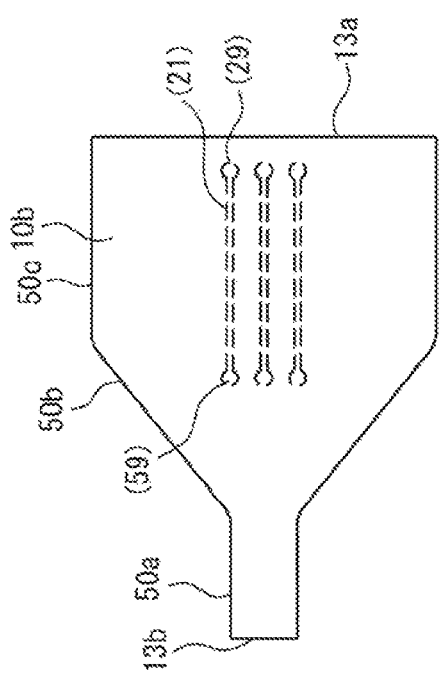
FIG. 10A is a plan view illustrating a stretchable base b having a stretchable connecting wiring portion formed thereon, as viewed from the upper surface side (upper side in FIG. 9)
Figure 10B:
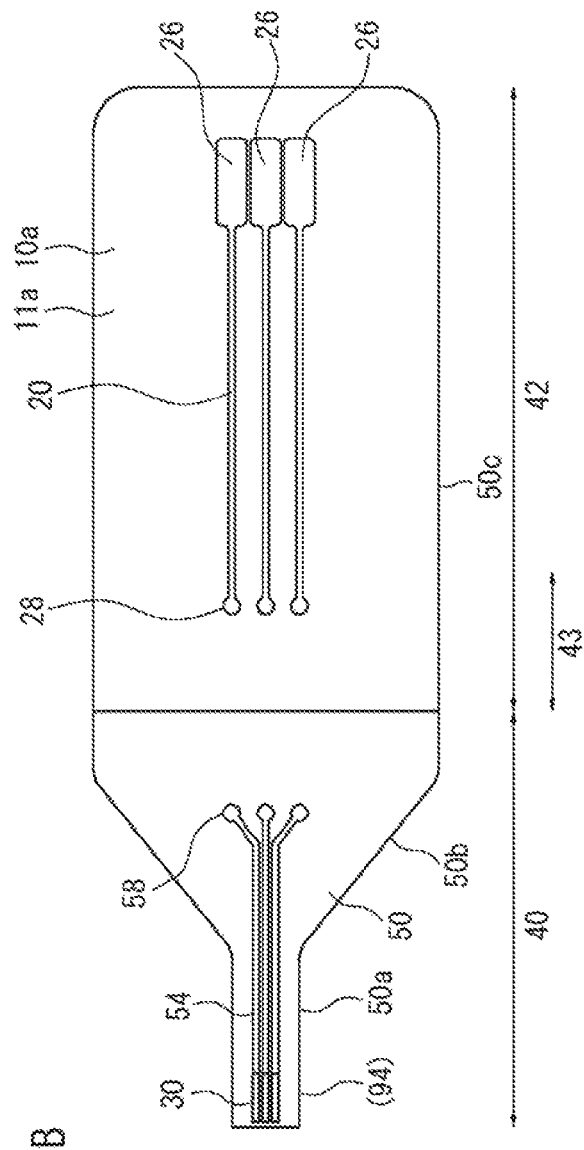
FIG. 10B is a plan view illustrating a stretchable base in a state where the stretchable base illustrated in FIG. 10A is removed from the stretchable circuit board, as viewed from the upper surface side (upper side in FIG. 9)

FIG. 10A is a plan view illustrating the stretchable base 10b having the stretchable connecting wiring portion 21 formed on the main surface 11b thereof, as viewed from the upper surface side (top side in FIG. 9). FIG. 10B is a plan view illustrating the stretchable base 10a in a state where the stretchable base 10b illustrated in FIG. 10A is removed from the stretchable circuit board 200, as viewed from the upper surface side (top side in FIG. 9).

The stretchable wiring portion 20 is a stretchable electroconductive pattern that is a pattern formed on one side or both sides of the stretchable base 10a. The stretchable wiring portion 20 illustrated in the drawings is formed on the main surface 11a that is one side of the stretchable base 10a. The shape of pattern of the stretchable wiring portion 20 is not particularly limited. FIG. 10B illustrates one mode as an example in which plural line-shaped stretchable wiring portions 20 are formed on the main surface 11a through printing. The wiring terminal portion 28 that forms a joining portion 56a is formed on one end of each of the stretchable wiring portions 20, and the electrode portion 26 is formed on the other end.

The shape of or the configuration of each of the electrode portions 26 is not particularly limited. The electrode portion 26 illustrated in FIG. 10B as an example is formed into a substantially square shape. However, the electrode portion 26 may be configured into a mode similar to that in the first exemplary embodiment (the first electrode 26a and the second electrode 26b).

Furthermore, the wiring terminal portion 28 of the stretchable wiring portion 20 is joined with a wiring terminal portion 29 of the stretchable connecting wiring portion 21, which will be described later, and forms the joining portion 56a. The shape of or the configuration of the wiring terminal portion 28 is not particularly limited. The wiring terminal portion 28 is formed so as to have a width wider than that of the stretchable wiring portion 20, for example, as with the wiring terminal portion 28 (see FIG. 3A) according to the first exemplary embodiment.

The stretchable connecting wiring portion 21 is a stretchable electroconductive pattern that is a pattern formed on one side or both sides of the stretchable base 10b. The stretchable connecting wiring portion 21 illustrated in the drawings is formed on the main surface 11b that is one side of the stretchable base 10b. The shape of pattern of the stretchable connecting wiring portion 21 is not particularly limited, provided that the stretchable connecting wiring portion 21 can be joined with the wiring terminal portion 28 of the stretchable wiring portion 20 described above and also can be joined with the wiring terminal portion 58 of the draw-out wiring portion 54 described later. FIG. 10A illustrates one mode as an example in which plural line-shaped stretchable connecting wiring portions 21 are formed on the main surface 11b through printing. On each of the stretchable connecting wiring portions 21, the wiring terminal portion 29, which forms the joining portion 56a in conjunction with the wiring terminal portion 28 of the stretchable wiring portion 20, is formed on one end of the stretchable connecting wiring portions 21, and a wiring terminal portion 59, which forms the joining portion 56b in conjunction with the wiring terminal portion 58 of the draw-out wiring portion 54 described later, is formed on the other end.

The wiring terminal portion 29 of the stretchable connecting wiring portion 21 is joined with the wiring terminal portion 28 of the stretchable wiring portion 20 to form the joining portion 56a, and the wiring terminal portion 59 is joined with the wiring terminal portion 58 of the draw-out wiring portion 54 described later to form the joining portion 56b. The shape of or the configuration of the wiring terminal portions 29 or 59 is not particularly limited. The wiring terminal portions 29 and 59 are formed, for example, so as to have a width wider than that of the stretchable connecting wiring portion 21.

Furthermore, the stretchable connecting wiring portion 21 extends over a step disposed in the top-bottom direction (upside direction in FIG. 9) between the main surface 11a of the stretchable base 10a and the main surface 52 of the reinforcement base 50, and joins the wiring terminal portion 28 of the stretchable wiring portion 20 and the wiring terminal portion 58 of the draw-out wiring portion 54 together. The stretchable connecting wiring portion 21 is joined with a part of the stretchable wiring portion 20 and a part of the draw-out wiring portion 54 through heating or application of pressure in a state where the stretchable connecting wiring portion 21 is formed on the stretchable base 10b through a printing method as described later, and hence, it is possible to prevent deterioration in wiring quality due to this step.

The stretchable bases 10a and 10b each have stretchability, and stretch in in-plane directions due to application of external force. The stretchable bases 10a and 10b each include one layer, or a layered body including plural layers and having stretchability. The stretchability, the base material, the thickness, the elongation percentage, and the like of the stretchable bases 10a and 10b are equal to those described in connection with the stretchable base 10 according to the first exemplary embodiment It is desirable that the stretchable bases 10a and 10b are made from the same base material and have the same thickness. This is because it is possible to reduce an increase in types of members, and simplify manufacturing processes. However, at least one of the base material and the thickness may differ between the stretchable base 10a and the stretchable base 10b.

The stretchable circuit board 200 may include the reinforcement area 40 and the stretchable area 42 having in-plane rigidity lower than that of this reinforcement area 40, and also having stretchability. The reinforcement area 40 and the stretchable area 42 have already been described in the first exemplary embodiment.

In the second exemplary embodiment, the stretchable area 42 includes a plane area only having the stretchable base 10a and a plane area (referred to as an intermediate area 43) having the stretchable base 10a and the stretchable base 10b layered therein. More specifically, this intermediate area 43 is an area in which the main surface 11b of the stretchable base 10b is directly joined with the main surface 11a of the stretchable base 10a and the main surface 52 of the reinforcement base 50, and covers a part of the main surface 11a of the stretchable base 10a and a part of the main surface 52 of the reinforcement base 50. As described above, since the intermediate area 43 has the stretchable base 10a and the stretchable base 10b layered therein, the intermediate area 43 has higher in-plane rigidity as compared with an area of the stretchable area 42 excluding the intermediate area 43. More specifically, in the stretchable area 42 according to the second exemplary embodiment, the in-plane rigidity decreases stepwise from an area (intermediate area 43) close to the reinforcement area 40. With this configuration, stress concentration is distributed in the vicinity of the boundary between the reinforcement area 40 and the stretchable area 42, whereby it is possible to prevent breakages of wires in the wiring portion.

Furthermore, in the example illustrated in FIG. 8 and FIG. 9, only one reinforcement area 40 is provided in the left portion of the stretchable circuit board 200. However, the configuration is not limited to this, and it may be possible to provide the reinforcement area 40 in plural locations.

The reinforcement base 50 is a member having in-plane rigidity higher than that of the stretchable bases 10a and 10b and forming the reinforcement area 40. The configuration, the base material, and the thickness of the reinforcement base 50 have already been described in the first exemplary embodiment. For example, the reinforcement base 50 may include the film base 60 having in-plane rigidity higher than that of the stretchable bases 10a and 10b, and may also include the adhesive enhancing layer 64.

The reinforcement base 50 illustrated in FIG. 8 and FIG. 9 as an example has the lower surface side joined with the stretchable base 10a, and the upper surface side joined with the stretchable base 10b. More specifically, the main surface 51 located on the lower surface side of the reinforcement base 50 is joined with the main surface 11a located on the upper surface side of the stretchable base 10a, and the main surface 52 located on the upper surface side of the reinforcement base 50 is joined with the main surface 11b located on the lower surface side of the stretchable base 10b. The reinforcement base 50 and the stretchable bases 10a and 10b are joined together through a method similar to that for joining together the stretchable base 10 and the reinforcement base 50 according to the first exemplary embodiment. In order to enhance an adhesive property, it may be possible to join the stretchable bases 10a and 10b and the reinforcement base 50 together using an adhesive enhancing layer 64 (for example, an adhesive, and a glue-type pressure-sensitive adhesive layer having a thin thickness and made from the same material as the stretchable bases 10a and 10b).

The draw-out wiring portion 54 is an electroconductive pattern that is a pattern formed on one side or both sides of the reinforcement base 50. The draw-out wiring portion 54 illustrated in the drawings is formed on the main surface 52 located on the upper surface side of the reinforcement base 50. The shape of pattern of the draw-out wiring portion 54 is not particularly limited. FIG. 10B illustrates one mode as an example in which plural line-shaped draw-out wiring portions 54 are formed on the main surface 52 through printing. On each of the draw-out wiring portions 54, the wiring terminal portion 58, which forms the joining portion 56b in conjunction with the wiring terminal portion 59 of the stretchable connecting wiring portion 21, is formed on one end of the draw-out wiring portion 54, and the terminal portion 30 is formed on the other end.

The wiring terminal portion 58 of the draw-out wiring portion 54 is joined with the wiring terminal portion 59 of the stretchable connecting wiring portion 21 to form the joining portion 56b. The shape of or the configuration of the wiring terminal portion 58 is not particularly limited. The wiring terminal portion 58 is formed, for example, so as to have a width wider than that of the draw-out wiring portion 54.

The terminal portion 30 is configured as a connector that is inserted into or removed from an external device (not illustrated). In the second exemplary embodiment, the terminal portion 30 is layered and formed on the surface on the upper surface side of the draw-out wiring portion 54 as illustrated in FIG. 9. However, the configuration of the terminal portion 30 is not limited to this. In addition, the thickness of and the base material of the terminal portion 30, the forming method for the terminal portion 30, and the like have already been described in the first exemplary embodiment.

Furthermore, in the second exemplary embodiment, the main surface 11b of the stretchable base 10b faces and is overlaid with the main surface 11a of the stretchable base 10a and the main surface 52 of the reinforcement base 50. In addition, the end portion of the stretchable wiring portion 20 and the end portion of the stretchable connecting wiring portion 21 are joined together at the joining portion 56a, and are electrically continuous with each other. The end portion of the draw-out wiring portion 54 and the end portion of the stretchable connecting wiring portion 21 are joined together at the joining portion 56b, and are electrically continuous with each other. With this configuration, the stretchable wiring portion 20 and the draw-out wiring portion 54 are electrically continuous through the stretchable connecting wiring portion 21.

More specifically, the wiring terminal portion 28 of the stretchable wiring portion 20 and the wiring terminal portion 29 of the stretchable connecting wiring portion 21 are integrally fused. Furthermore, the wiring terminal portion 58 of the draw-out wiring portion 54 and the wiring terminal portion 59 of the stretchable connecting wiring portion 21 are integrally fused. Since the stretchable wiring portion 20 and the draw-out wiring portion 54 are fused into one piece with the stretchable connecting wiring portion 21 as described above, the joining portions 56a and 56b also have stretchability. As a result, in the case where the stretching movement acts on the stretchable circuit board 200, it is possible to prevent breakage of wires in the wiring portion, and to prevent breakage of the electrically conducting state. In addition, the joining portions 56a and 56b are formed at a position spaced apart from the vicinity of the boundary between the reinforcement area 40 and the stretchable area 42, and hence, it is possible to prevent breakage of wires in the wiring portion caused by stress concentration.

The stretchable wiring portion 20, the stretchable connecting wiring portion 21, and the draw-out wiring portion 54 are made from an electrically conductive material prepared in a manner such that electrically conductive particles are dispersed in a resin material. This electrically conductive material has already been described in relation to the stretchable wiring portion 20 according to the first exemplary embodiment. Since the stretchable wiring portion 20, the stretchable connecting wiring portion 21, and the draw-out wiring portion 54 contain a resin binder, it is possible to prevent breakage of the stretchable wiring portion 20, the stretchable connecting wiring portion 21, and the draw-out wiring portion 54 due to stretching of the stretchable bases 10a and 10b. This resin binder has already been described in the first exemplary embodiment.

It is desirable to use the same type of resin material for the electrically conductive material to form the stretchable wiring portion 20, the stretchable connecting wiring portion 21, and the draw-out wiring portion 54. This is because it is possible to enhance electrical and mechanical connectivity when the wiring portions are fused into one piece, and it is possible to enhance reliability and durability in the case where the stretchable circuit board 200 is stretched. For example, by using an elastomer material as the resin binder for the stretchable wiring portion 20, the stretchable connecting wiring portion 21, and the draw-out wiring portion 54, it is possible to melt and fuse wiring portions into one piece through at least one of application of heat and application of pressure when the wiring portions are joined together. By configuring the stretchable wiring portion 20, the stretchable connecting wiring portion 21, and the draw-out wiring portion 54 so as to contain a thermoplastic resin binder, it is possible to fuse wires into one piece using a fusing property of the binder, and to mechanically and electrically connect the wires with each other.

However, it may be possible to use a thermoplastic resin as the resin binder for one of two wiring portions to be joined together. For example, it may be possible to use a thermoplastic resin as the resin binder only for the intervening stretchable connecting wiring portion 21. Even in this case, it is possible to mechanically and electrically connect wires using the fusing property of the stretchable connecting wiring portion 21.

Furthermore, the draw-out wiring portion 54 may have stretchability, or may not have stretchability. This is because the draw-out wiring portion 54 is disposed in the reinforcement area 40 having in-plane rigidity higher than that of the stretchable area 42, and hence, the degree of stretching of the reinforcement area 40 is smaller than that of the stretchable area 42 when stretching movements act on the stretchable circuit board 200.

There is no particular limitation to the method for forming the stretchable wiring portion 20, the stretchable connecting wiring portion 21, and the draw-out wiring portion 54. For example, these wiring portions may be formed through a printing method. This printing method has already been described in the first exemplary embodiment. It is only necessary that the electrode portion 26 and the wiring terminal portion 28 of the stretchable wiring portion 20, the wiring terminal portions 29 and 59 of the stretchable connecting wiring portion 21, and the wiring terminal portion 58 of the draw-out wiring portion 54 are formed by printing through the same process as that used for each of the wiring portions. With this formation, the manufacturing process can be simplified, and in addition, the wiring terminal portions 28, 29, 58 and 59 can also have stretchability.

The draw-out wiring portion 54 may be formed through another method (for example, through an etching method). The etching method has already been described in the first exemplary embodiment.

It is only necessary to determine the thickness size and the width size of each of the stretchable wiring portion 20, the stretchable connecting wiring portion 21, and the draw-out wiring portion 54 on the basis of, for example, resistivity of each of the wiring portions at no load, a change in resistance of the stretchable circuit board 200 when it is stretched, and restriction on the thickness size and the width size of the stretchable circuit board 200 as a whole. The preferable thickness size and width size of each of the wiring portions are the same as those of the stretchable wiring portion 20 described in the first exemplary embodiment.

As illustrated in FIG. 10B, the stretchable base 10*a* according to the second exemplary embodiment has a main-surface shape including: a band-shaped portion 50*a* that has a narrow width and forms a cable portion; a wide width portion 50*c* that has a width wider than that of this band-shaped portion 50*a*; and a width increasing portion 50*b* that has a width size (the size in the top-bottom direction of FIG. 10B) increasing from the band-shaped portion 50*a* toward the wide width portion 50*c*. This main-surface shape directly forms a plane shape of the stretchable circuit board 200 according to the second exemplary embodiment. The stretchable area 42 is provided in the wide width portion 50*c*.

The reinforcement base 50 has the main surface having the same shape as the band-shaped portion 50*a* of the stretchable base 10*a*, the width increasing portion 50*b*, and the distal end portion of the wide width portion 50*c* located on the side of the band-shaped portion 50*a*. With this configuration, by overlaying the reinforcement base 50 and the stretchable base 10*a* with each other, it is possible to stably maintain the shape of the stretchable circuit board 200 throughout the entire width of the stretchable base 10*a*, whereby favorable handleability can be achieved. The terminal portion 30 is disposed in the band-shaped portion 50*a*, and the wiring terminal portion 58 is disposed in the width increasing portion 50*b*. The draw-out wiring portion 54 is patterned in a manner such that draw-out wiring portions 54 are formed in parallel from the band-shaped portion 50*a* to the midpoint of the width increasing portion 50*b*, and radially expand toward each wiring terminal portion 58.

As illustrated in FIG. 10A, the stretchable base 10*b* also has the main surface having the same shape as the band-shaped portion 50*a* of the stretchable base 10*a*, the width increasing portion 50*b*, and the distal end portion of the wide width portion 50*c* located on the side of the band-shaped portion 50*a*, as with the reinforcement base 50. However, the band-shaped portion 50*a* of the stretchable base 10*b* has a length (the length in the left-right direction in the drawing) shorter than that of the band-shaped portion 50*a* of each of the stretchable base 10*a* and the reinforcement base 50, and the wide width portion 50*c* of the stretchable base 10*b* has a length (the length in the left-right direction in the drawing) longer than that of the wide width portion 50*c* of the reinforcement base 50. Furthermore, the wide width portion 50*c* of the stretchable base 10*b* forms a part of the reinforcement area 40 and the intermediate area 43 within the stretchable area 42. The wiring terminal portions 59 and 29 are disposed in the width increasing portion 50*b* and the wide width portion 50*c*, respectively, and the stretchable connecting wiring portion 21 is patterned into a straight shape.

The main surface 11*b* of the stretchable base 10*b* having the stretchable connecting wiring portion 21 formed thereon is directly joined with the main surface 11*a* of the stretchable base 10*a* having the stretchable wiring portion 20 formed thereon, and is also directly joined with the main surface 52 having the draw-out wiring portion 54 formed thereon and located on the reinforcement base 50 layered on the main surface 11*a*. More specifically, the stretchable base 10*b* is overlaid in a manner such that the end edge 13*b* of the stretchable base 10*b* is disposed at a position that overlaps with a part of the terminal portion 30 formed at the distal end portion of the draw-out wiring portion 54, and the end edge 13*a* of the stretchable base 10*b* is disposed at a position located on the side of the electrode portion 26 with respect to the wiring terminal portion 28 of the stretchable wiring portion 20. Thus, the main surface 11*b* of the stretchable base 10*b* covers a part of the main surface 11*a* of the stretchable base 10*a* and a part of the main surface 52 of the reinforcement base 50 (area excluding the area where the terminal portion 30 is exposed).

A reinforcing member 94 is provided in an area (distal end portion) in the reinforcement area 40 where the terminal portion 30 is formed. The reinforcing member 94 according to the second exemplary embodiment is provided on the main surface of the stretchable base 10*a* located on a side opposite to the reinforcement base 50, and disposed at the distal end portion where the terminal portion 30 is formed. The reinforcing member 94 is a spacer member for adjusting the thickness of the distal end portion of the reinforcement base 50 so as to have the accuracy set, for example, for a connector (not illustrated) of an external device when the terminal portion 30 is fitted, for example, to this connector, and is connected with this external device. The material of the reinforcing member 94 and the method for joining the reinforcing member 94 have already been described in the first exemplary embodiment.

Below, the method (hereinafter, referred to as the present method) for manufacturing the stretchable circuit board 200 according to the second exemplary embodiment will be described. FIG. 11 is a schematic view illustrating manufacturing processes for the stretchable circuit board 200.

The present method at least includes a stretchable wiring forming step, a draw-out line forming step, and a joining step. The order as to which of the stretchable wiring forming step and the draw-out line forming step is performed first may be freely determined.

In the stretchable wiring forming step, the stretchable connecting wiring portion 21 (stretchable wiring portion) having stretchability is formed on the main surface 11*b*, which is located on at least one side of the stretchable base 10*b* (second stretchable base). In the draw-out line forming step, the draw-out wiring portion 54 is formed on the main surface 52 located on at least one side of the reinforcement base 50 having in-plane rigidity higher than that of the stretchable base 10*b*. In the joining step, the main surface 52 of the reinforcement base 50 is overlaid with a part of an area where the stretchable wiring portion 21 is formed, in a manner such that the main surface 52 faces the main surface 11*b* of the stretchable base 10*b*, and a part of the stretchable connecting wiring portion 21 and a part of the draw-out wiring portion 54 are joined together, and are electrically continuous with each other.

Next, the present method will be described in detail.

More specifically, the present method includes a step of forming the stretchable wiring portion 20, a step of forming the draw-out wiring portion 54, a step of forming the stretchable connecting wiring portion 21, a step of joining the reinforcement base 50, and a step of joining the wiring portions. However, in the case where the reinforcement base 50 is not joined with the stretchable base 10*a* in the stretchable circuit board 200, the step of joining the reinforcement base 50 is omitted.

In the step of forming the stretchable wiring portion 20, the stretchable base 10*a* is prepared, and an electroconductive paste is applied on the main surface 11*a* of the stretchable base 10*a* through a printing method to form the stretchable wiring portion 20, the wiring terminal portion 28, and the electrode portion 26. In order to enhance handleability of the stretchable base 10*a* having stretchability, it is preferable to laminate the lower surface (an surface located on a side opposite to the main surface 11*a*) of the stretchable base 10*a* with a separator made from paper or a film material, or a release. It is preferable to detach the separator or release from the stretchable base 10a as needed.

The reinforcing member 94 is joined with the lower surface of the stretchable base 10a before or after this step. The reinforcing member 94 can be joined with the stretchable base 10a using a general pressure-sensitive adhesive or adhesive.

In the step of forming the draw-out wiring portion 54, the reinforcement base 50 is prepared, and an electroconductive paste is applied on the main surface 52 of the reinforcement base 50 through a printing method to form the draw-out wiring portion 54 and the wiring terminal portion 58. Furthermore, the terminal portion 30 is formed at the end portion (distal end portion) of the formed draw-out wiring portion 54 located on the side opposite to the wiring terminal portion 58, for example, through a method such as printing of a carbon paste.

In the case where the adhesive enhancing layer 64 is used to join the reinforcement base 50 and the stretchable base 10b together, the film base 60 that forms the reinforcement base 50 is prepared, and the adhesive enhancing layer 64 is layered and formed on a side of the main surface 52 of the reinforcement base 50. Then, an electroconductive paste is applied on the adhesive enhancing layer 64 through a printing method to form the draw-out wiring portion 54 and the wiring terminal portion 58.

In addition, in the case where the adhesive enhancing layer 64 is used to join the reinforcement base 50 and the stretchable base 10a together, it may be possible to layer and form the adhesive enhancing layer 64 on a side of the main surface 51 of the film base 60.

In the step of forming the stretchable connecting wiring portion 21, the stretchable base 10b is prepared, and an electroconductive paste is applied on the main surface 11b of the stretchable base 10b through a printing method to form the stretchable connecting wiring portion 21 and the wiring terminal portions 29 and 59. In order to enhance handleability of the stretchable base 10b, it is preferable to laminate the upper surface (a surface located on a side opposite to the main surface 11b) of the stretchable base 10b with a separator made from a paper material and the like. It is preferable to detach the separator from the stretchable base 10b on an as-needed basis such as when the stretchable circuit board 200 is used.

In the step of joining the reinforcement base 50, the main surface 11a of the stretchable base 10a and the main surface 51 of the reinforcement base 50 are directly joined together. The method for joining the reinforcement base 50 and the stretchable base 10a together is similar to that for joining the reinforcement base 50 and the stretchable base 10 together in the first exemplary embodiment. For example, the reinforcement base 50 and the stretchable base 10a are joined together using the adhesive enhancing layer 64 as described above.

In the step of joining wiring portions, the stretchable base 10b having the stretchable connecting wiring portion 21 formed thereon is first aligned with the position of the stretchable base 10a joined with the reinforcement base 50 and having the stretchable wiring portion 20 formed thereon, in a state where the main surface 11b of the stretchable base 10b faces the main surface 11a of the stretchable base 10a and the main surface 52 of the reinforcement base 50. As illustrated in FIG. 10A, the shape in plane view formed by the band-shaped portion 50a, the width increasing portion 50b, and a part of the wide width portion 50c is equal between the stretchable base 10a and the stretchable base 10b, and hence, the alignment is performed, for example, in a manner such that the edge lines of the respective width increasing portions 50b are matched or are in parallel to each other.

Next, the stretchable base 10a, the reinforcement base 50, and the stretchable base 10b are heated or pressed to join the main surface 11b of the stretchable base 10b directly with the main surface 52 of the reinforcement base 50 and the main surface 11a of the stretchable base 10a; the wiring terminal portion 28 of the stretchable wiring portion 20 is fused with the wiring terminal portion 29 of the stretchable connecting wiring portion 21; and the wiring terminal portion 58 of the draw-out wiring portion 54 and the wiring terminal portion 59 of the stretchable connecting wiring portion 21 are fused into one piece. With these processes, the joining portion 56a at which the wiring terminal portion 28 and the wiring terminal portion 29 are fused is formed, so that the stretchable wiring portion 20 and the stretchable connecting wiring portion 21 are electrically continuous with each other. In addition, the joining portion 56b where the wiring terminal portion 59 and the wiring terminal portion 58 are fused is formed, and the draw-out wiring portion 54 and the stretchable connecting wiring portion 21 are electrically continuous with each other. Thus, the stretchable wiring portion 20 and the draw-out wiring portion 54 are electrically continuous through the stretchable connecting wiring portion 21.

The method for joining the stretchable base 10b and the reinforcement base 50 together is similar to that for joining the reinforcement base 50 and the stretchable base 10 together according to the first exemplary embodiment. The joining of the stretchable base 10a with the stretchable base 10b is achieved by applying heat pressing (heating and pressing) to the stretchable bases 10a and 10b, and fusing them with each other using a thermal fusing property of base materials of the stretchable base 10a and the stretchable base 10b. As for the heating means, it may be possible to employ a laminating method using a heating roll, and heating-pressuring means. Application of pressure and pressing may be performed in an atmospheric condition, or may be performed in a vacuum. Furthermore, heating and pressing may be applied to the stretchable base 10a, the reinforcement base 50, or the stretchable base 10b in an indirect manner, rather than in a direct manner. For example, the reinforcement base 50 may be heated or pressed indirectly by way of the stretchable base 10a and the stretchable base 10b, rather than being heated or pressed in a direct manner.

Furthermore, the manufacturing method has been described as an example, in which the step of joining the reinforcement base 50 is already completed before the step for joining wiring portions. However, the step of joining wiring portions may include the step of joining the reinforcement base 50. In this case, the stretchable base 10b having the stretchable connecting wiring portion 21 formed thereon, the reinforcement base 50 having the draw-out wiring portion 54 formed thereon, and the stretchable base 10a having the stretchable wiring portion 20 formed thereon in a state where the reinforcement base 50 is not joined are aligned with each other, and in this state, these bases are joined together through application of heat pressing.

As described above, the stretchable circuit board 200 according to the second exemplary embodiment can be manufactured through simple steps in which the stretchable bases 10a and 10b each having a wiring portion formed thereon, and the reinforcement base 50 are aligned with each other, and then, heating and application of pressure are performed to them. Furthermore, the present method does not include a step of printing a stretchable wiring portion so as to cross a boarder between the stretchable area 42 and the reinforcement area 40, and hence, it is possible to prevent deterioration in wiring quality of wiring portions at the boundary portion between the reinforcement area 40 and the stretchable area 42.

First Modification of Second Exemplary Embodiment

Figure 12:
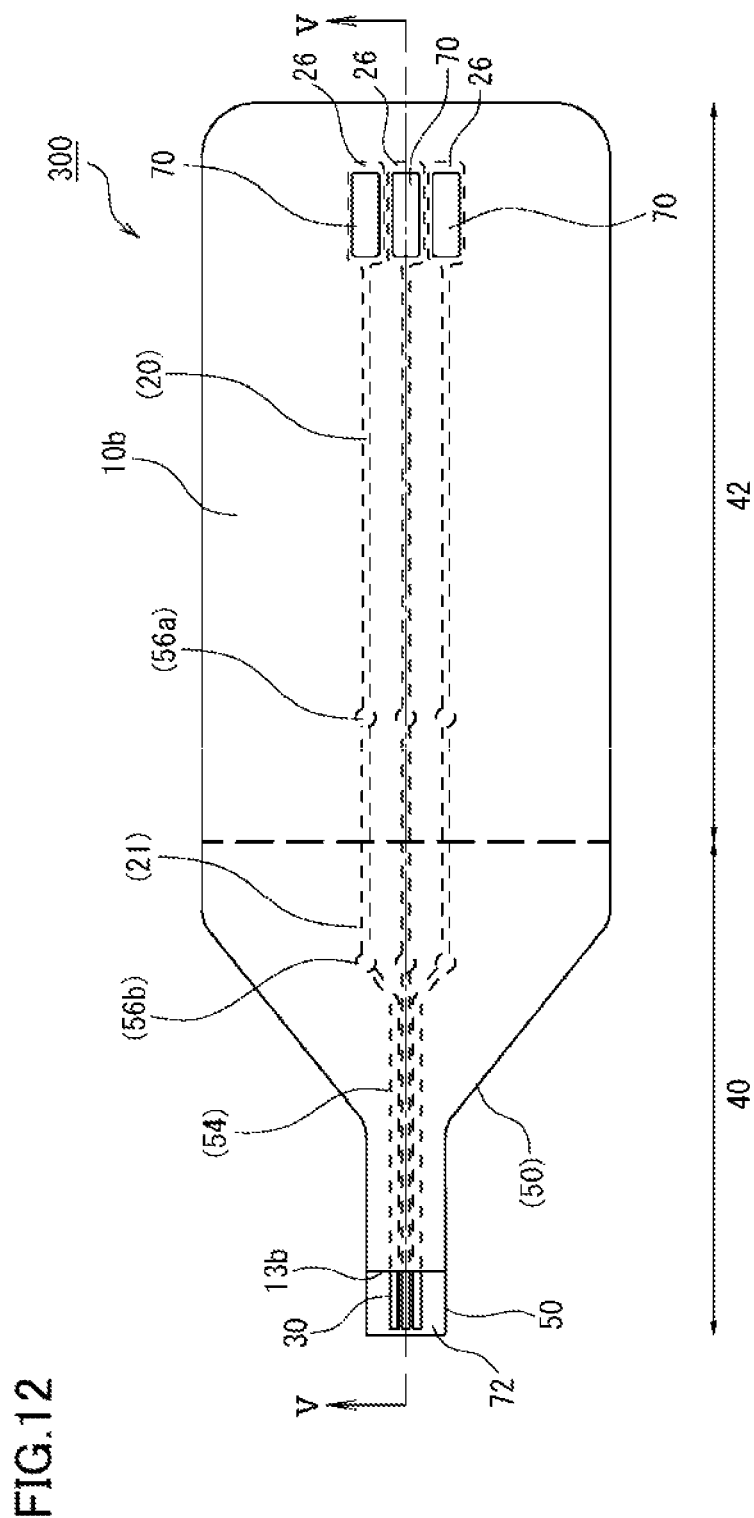
FIG. 12 is a plan view illustrating a stretchable circuit board according to a modification of the second exemplary embodiment of the present invention.
Figure 13:
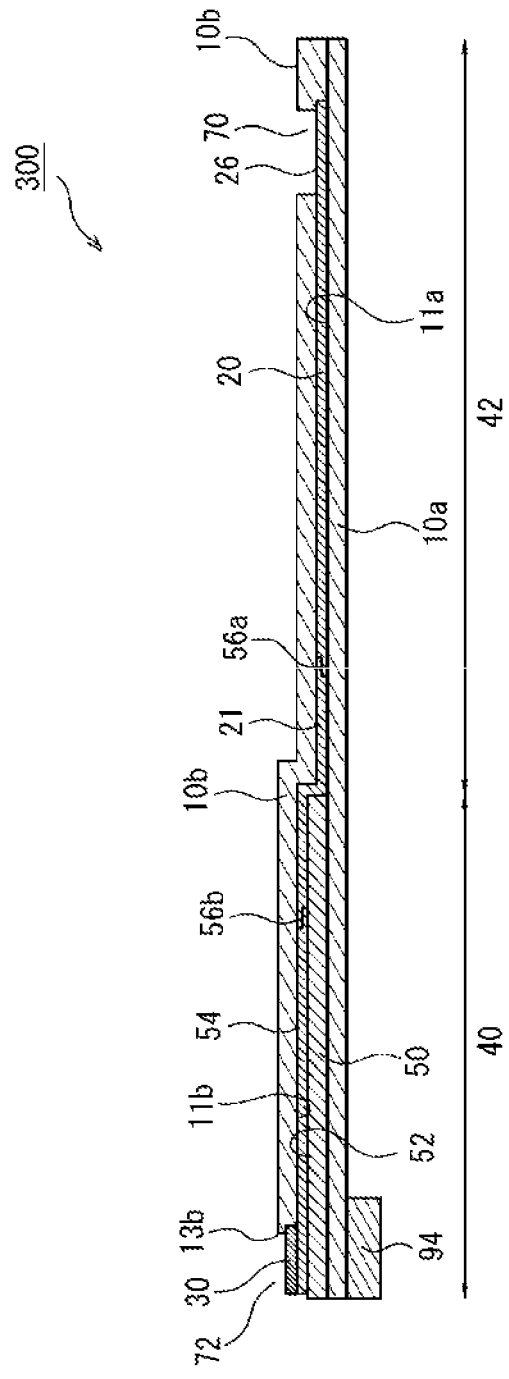
FIG. 13 is a sectional view taken along the line V-V in FIG. 12.

Below, a stretchable circuit board 300 according to a first modification of the second exemplary embodiment (hereinafter, referred to as a first modification) will be described with focus being placed on details different from those in the second exemplary embodiment described above. FIG. 12 is a plan view illustrating the stretchable circuit board 300 according to a modification of the second exemplary embodiment of the present invention, and FIG. 13 is a sectional view taken along the line V-V in FIG. 12.

In the case of the stretchable circuit board 300 according to the first modification, the main surface 11b of the stretchable base 10b entirely covers all of the stretchable wiring portion 20 and the draw-out wiring portion 54 except for the electrode portion 26 and the terminal portion 30. In the example illustrated in FIG. 12 and FIG. 13, the stretchable circuit board 300 entirely covers the main surface 11a of the stretchable base 10a and the main surface 52 of the reinforcement base 50 except for certain partial areas. These partial areas are plural electrode exposing portions 70 that each expose each electrode portion 26 in the upward direction of the stretchable circuit board 300 (in the upward direction of the paper of FIG. 13), and a terminal exposing portion 72 that exposes the terminal portion 30 in the same upward direction. However, each of these partial areas may include an area other than the electrode exposing portions 70 and the terminal exposing portion 72, provided that the main surface 11a of the stretchable base 10a and the main surface 52 of the reinforcement base 50 are covered entirely. Unlike the second exemplary embodiment, the stretchable circuit board 300 according to the first modification has the reinforcement area 40 and the stretchable area 42, and does not have the intermediate area 43.

In the case where at least the stretchable wiring portion 20 and the stretchable connecting wiring portion 21 are made from a base material having stretchability with reduced Young's modulus, it is desirable that the stretchable base 10b is also made from the same base material as that of these wiring portions in order to enhance durability of these wiring portions.

As described above, in the first modification, the stretchable base 10b entirely covers the stretchable wiring portion 20, the stretchable connecting wiring portion 21, and the draw-out wiring portion 54. With this configuration, the stretchable base 10b not only has a wire connecting function between the stretchable wiring portion 20 and the draw-out wiring portion 54 as in the second exemplary embodiment, but also functions as a stretchable cover that covers each wiring portions. In other words, in the first modification, the stretchable cover (stretchable base 10b) is configured to have the stretchable connecting wiring portion 21, and hence, through the step of joining the stretchable cover, it is possible to achieve both wiring connection and covering, so that both the structure and the manufacturing processes can be streamlined.

Second Modification of Second Exemplary Embodiment

In the second exemplary embodiment described above, no specific description has been made of the protection layer 90. The stretchable circuit board 200 according to the second exemplary embodiment described above may further include a protection layer 90 that covers a surface on which the stretchable wiring portion 20, which is formed on the main surface 11a of the stretchable base 10a, is formed. In addition, the protection layer 90 may not only be provided on the surface on which the stretchable wiring portion 20 is formed, but also be provided so as to cover at least a part of the upper surface (a surface located opposite to the main surface 11b) of the stretchable base 10b.

Figure 14:
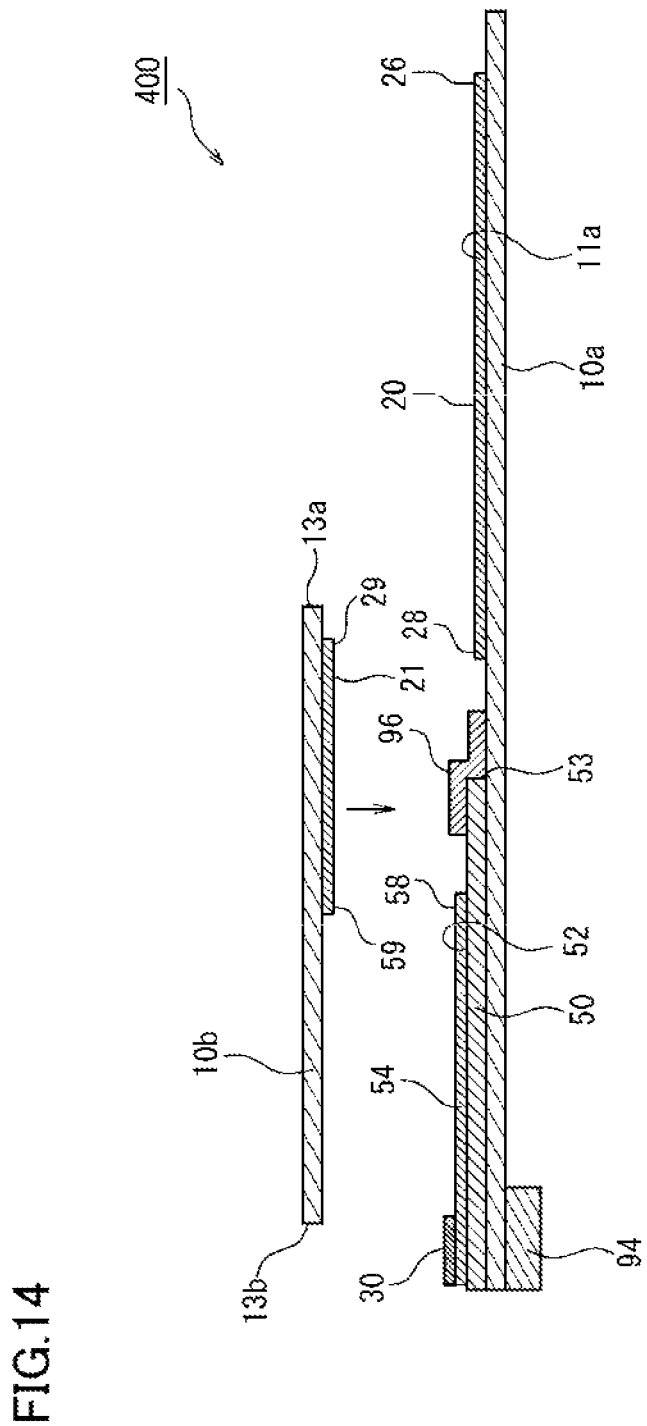
FIG. 14 is a sectional view taken along the line W-W in FIG. 8 on the assumption that FIG. 8 is a plan view illustrating a stretchable circuit board according to a second modification of the second exemplary embodiment.

FIG. 14 is a sectional view taken along the line W-W in FIG. 8 on the assumption that FIG. 8 is a plan view illustrating a stretchable circuit board 400 according to the second modification of the second exemplary embodiment. However, for the purpose of facilitating understanding, FIG. 14 illustrates a state where the stretchable base 10b having the stretchable connecting wiring portion 21 formed thereon is removed from the stretchable circuit board 400. As illustrated in FIG. 14, a stretchable supporting member 96 may be provided.

More specifically, in the second modification, the stretchable supporting member 96 may be provided so as to extend over the end edge 53 of the reinforcement base 50 and from the end portion of the main surface 52 of the reinforcement base 50 to the end portion of the main surface 11a of the stretchable base 10a. In this case, at the time when the stretchable base 10b having the stretchable connecting wiring portion 21 formed thereon is joined with the reinforcement base 50 and the stretchable base 10a, the stretchable connecting wiring portion 21 extends over a step between the main surface 52 of the reinforcement base 50 and the main surface 11a of the stretchable base 10a, and is brought into contact with each of the main surfaces. Although the stretchable connecting wiring portion 21 can eliminate this step due to its stretchability, the stretchable supporting member 96 can alleviate this step, so that breakage of the stretchable connecting wiring portion 21 during the manufacturing processes can be reliably prevented.

It should be noted that the base material of the stretchable supporting member 96 has already been described in the first exemplary embodiment.

It should be noted that the present invention should not be limited to each of the exemplary embodiments and each of the modifications described above, and various changes, improvements or other modes should be included, provided that the object of the present invention is achieved.

For example, it may be possible that the stretchable circuit boards 100, 200, 300, and 400 (hereinafter, referred to as 100 and so on) are provided with an affixing layer (not illustrated) for attaching the stretchable circuit board 100 and so on, for example, on the surface of a human body or the surface of a robot. Depending on applications of the stretchable circuit board 100 and so on, the affixing layer may be provided on the upper surface side (may be provided on the protection layer 90) of the stretchable circuit board 100 and so on, or may be provided on the lower surface side (in other words, on a surface of the stretchable base 10 opposite to the main surface 11, and a surface of the stretchable base 10a opposite to the main surface 11a). The affixing layer may be made from a gel agent or pressure-sensitive adhesive.

Various constituent elements of the stretchable circuit board 100 and so on according to the present invention need not exist separately. It may be possible to employ, for example, a configuration in which plural constituent elements are formed as one member, a configuration in which one constituent element is formed by plural members, a configuration in which one constituent element forms a part of another constituent element, a configuration in which a part of one constituent element overlaps with a part of another constituent element.

The exemplary embodiments described above include the following technical ideas.

(1) A stretchable circuit board includes:
   a stretchable base;
   a stretchable wiring portion formed on a main surface located on at least one side of the stretchable base, and having stretchability;
   a reinforcement base having in-plane rigidity higher than that of the stretchable base; and
   a draw-out wiring portion formed on a main surface located on at least one side of the reinforcement base, in which
   the main surface of the reinforcement base is overlaid with a part of an area where the stretchable wiring portion is formed, in a manner such that the main surface of the reinforcement base faces the main surface of the stretchable base, and
   a part of the stretchable wiring portion and a part of the draw-out wiring portion are joined together, and are electrically continuous with each other.

(2) The stretchable circuit board according to (1) described above, in which
   the main surface of the stretchable base and the main surface of the reinforcement base are directly joined together, and a part of the stretchable wiring portion and a part of the draw-out wiring portion are integrally fused.

(3) The stretchable circuit board according to (1) or (2) described above, in which
   the reinforcement base includes a film base having in-plane rigidity higher than that of the stretchable base, and an adhesive enhancing layer layered on the film base,
   the draw-out wiring portion is formed on a main surface of the adhesive enhancing layer located on a side opposite to the film base, and
   the adhesive enhancing layer and the stretchable base are integrally joined together.

(4) The stretchable circuit board according to any one of (1) to (3) described above, in which
   a terminal portion is formed on the main surface of the reinforcement base, and is connected with the draw-out wiring portion, and
   the terminal portion is made from a material different from that of the draw-out wiring portion.

(5) The stretchable circuit board according to (4) described above, in which
   the stretchable base covers at least a part of the draw-out wiring portion, and
   a part of an end edge of the stretchable base is located closer to the terminal portion, than to the stretchable wiring portion.

(6) The stretchable circuit board according to any one of (1) to (5) described above, in which
   the stretchable wiring portion and the draw-out wiring portion are made from an electrically conductive material prepared in a manner such that an electrically conductive particle is dispersed in a resin material, and
   the resin material in the electrically conductive material forming the stretchable wiring portion and the draw-out wiring portion belongs to the same type.

(7) A method for manufacturing a stretchable circuit board, which includes:
   forming a stretchable wiring portion having stretchability, on a main surface located on at least one side of a stretchable base;
   forming a draw-out wiring portion on a main surface located on at least one side of a reinforcement base having in-plane rigidity higher than the stretchable base; and
   overlaying the main surface of the reinforcement base with a part of an area where the stretchable wiring portion is formed, in a manner such that the main surface of the reinforcement base faces the main surface of the stretchable base, and joining together a part of the stretchable wiring portion and a part of the draw-out wiring portion to cause these parts to be electrically continuous with each other.

(8) The method for manufacturing a stretchable circuit board according to (7) described above, in which
   the stretchable base and the reinforcement base are heated or pressed to directly join the main surface of the stretchable base and the main surface of the reinforcement base together, and a part of the stretchable wiring portion and a part of the draw-out wiring portion are integrally fused.

(9) A stretchable circuit board includes:
   a first stretchable base;
   a stretchable wiring portion formed on a main surface located on at least one side of the first stretchable base, and having stretchability;
   a reinforcement base having in-plane rigidity higher than that of the first stretchable base; and
   a draw-out wiring portion formed on a main surface located on at least one side of the reinforcement base,
   a second stretchable base; and
   a stretchable connecting wiring portion formed on a main surface located on at least one side of the second stretchable base, and having stretchability, in which
   the main surface of the second stretchable base faces and is overlaid with the main surface of the first stretchable base and the main surface of the reinforcement base on the side of the draw-out wiring portion,
   a part of the stretchable wiring portion and a part of the stretchable connecting wiring portion are joined together,
   a part of the draw-out wiring portion and a part of the stretchable connecting wiring portion are joined together, and
   the stretchable wiring portion and the draw-out wiring portion are electrically continuous with each other through the stretchable connecting wiring portion.

(10) The stretchable circuit board according to (9) described above, in which
   a main surface of the reinforcement base located on a side opposite to the draw-out wiring portion and the main surface of the first stretchable base are joined together.

(11) The stretchable circuit board according to (9) or (10) described above, in which
   a part of the stretchable wiring portion and a part of the stretchable connecting wiring portion are integrally fused, and
   a part of the draw-out wiring portion and a part of the stretchable connecting wiring portion are integrally fused.

(12) The stretchable circuit board according to any one of (9) to (11), in which
   the main surface of the second stretchable base is joined directly with the main surface of the first stretchable base and the main surface of the reinforcement base on the side of the draw-out wiring portion, and covers at least a part of the main surface of the first stretchable base and at least a part of the main surface of the reinforcement base.

(13) The stretchable circuit board according to (12) described above, in which
the main surface of the second stretchable base entirely covers the stretchable wiring portion and the draw-out wiring portion except for an electrode portion of the stretchable wiring portion and a terminal portion of the draw-out wiring portion.

(14) The stretchable circuit board according to any one of (9) to (13) described above, in which
the stretchable wiring portion, the draw-out wiring portion, and the stretchable connecting wiring portion are made from an electrically conductive material prepared in a manner such that an electrically conductive particle is dispersed in a resin material, and
the resin material in the electrically conductive material forming the stretchable wiring portion, the draw-out wiring portion, and the stretchable connecting wiring portion belongs to the same type.

(15) A method for manufacturing a stretchable circuit board includes:
forming a stretchable wiring portion on a main surface located on at least one side of a first stretchable base;
forming a draw-out wiring portion on a main surface located on one side of a reinforcement base having in-plane rigidity higher than that of the first stretchable base;
forming a stretchable connecting wiring portion on a main surface located on at least one side of a second stretchable base; and
overlaying the main surface of the second stretchable base so as to face the main surface of the first stretchable base and the main surface of the reinforcement base on the side of the draw-out wiring portion, joining together a part of the stretchable wiring portion and a part of the stretchable connecting wiring portion, joining together a part of the draw-out wiring portion and a part of the stretchable connecting wiring portion, and causing the stretchable wiring portion and the draw-out wiring portion to be electrically continuous with each other through the stretchable connecting wiring portion.

(16) The method for manufacturing a stretchable circuit board according to (15) described above, in which
the first stretchable base, the reinforcement base, and the second stretchable base are heated or pressed to directly join the main surface of the second stretchable base with the main surface of the first stretchable base and the main surface of the reinforcement base,
a part of the stretchable wiring portion and a part of the stretchable connecting wiring portion are integrally fused, and
a part of the draw-out wiring portion and a part of the stretchable connecting wiring portion are integrally fused.

(17) The method for manufacturing a stretchable circuit board according to (15) or (16) described above, further including
joining together the main surface of the first stretchable base and a main surface of the reinforcement base located on a side opposite to the draw-out wiring portion.

What is claimed is:
1. A stretchable circuit board, comprising:
a stretchable base;
a stretchable wiring portion formed on a main surface located on at least one side of the stretchable base, and having stretchability;
a reinforcement base having in-plane rigidity higher than that of the stretchable base; and
a draw-out wiring portion formed on a main surface located on at least one side of the reinforcement base, wherein
the main surface of the reinforcement base is overlaid with a part of an area of the main surface of the stretchable base, where the stretchable wiring portion is formed, in a manner such that the main surface of the reinforcement base faces the main surface of the stretchable base, and
a part of the stretchable wiring portion and a part of the draw-out wiring portion are joined together, and are electrically continuous with each other.

2. The stretchable circuit board according to claim 1, wherein
the main surface of the stretchable base and the main surface of the reinforcement base are directly joined together, and a part of the stretchable wiring portion and a part of the draw-out wiring portion are integrally fused.

3. The stretchable circuit board according to claim 1, wherein
the reinforcement base includes a film base having in-plane rigidity higher than that of the stretchable base, and an adhesive enhancing layer layered on the film base,
the draw-out wiring portion is formed on a main surface of the adhesive enhancing layer located on a side opposite to the film base, and
the adhesive enhancing layer and the stretchable base are integrally joined together.

4. The stretchable circuit board according to claim 1, wherein
a terminal portion is formed on the main surface of the reinforcement base, and is connected with the draw-out wiring portion, and
the terminal portion is made from a material different from that of the draw-out wiring portion.

5. The stretchable circuit board according to claim 4, wherein
the stretchable base covers at least a part of the draw-out wiring portion, and
a part of an end edge of the stretchable base is located closer to the terminal portion, than to the stretchable wiring portion.

6. The stretchable circuit board according to claim 1, wherein
the stretchable wiring portion and the draw-out wiring portion are made from an electrically conductive material prepared in a manner such that an electrically conductive particle is dispersed in a resin material, and
the resin material in the electrically conductive material forming the stretchable wiring portion and the draw-out wiring portion belongs to the same type.

7. A method for manufacturing a stretchable circuit board, comprising:
forming a stretchable wiring portion having stretchability, on a main surface located on at least one side of a stretchable base;
forming a draw-out wiring portion on a main surface located on at least one side of a reinforcement base having in-plane rigidity higher than that of the stretchable base; and overlaying the main surface of the reinforcement base with a part of an area of the main surface of the stretchable base where the stretchable wiring portion is formed, in a manner such that the main surface of the reinforcement base faces the main surface of the stretchable base, and joining together a part of the stretchable wiring portion and a part of the draw-out wiring portion to cause these parts to be electrically continuous with each other.

8. The method for manufacturing a stretchable circuit board according to claim 7, wherein
the stretchable base and the reinforcement base are heated or pressed to directly join the main surface of the stretchable base and the main surface of the reinforcement base together, and a part of the stretchable wiring portion and a part of the draw-out wiring portion are integrally fused.

9. A stretchable circuit board, comprising:
a first stretchable base;
a stretchable wiring portion formed on a main surface located on at least one side of the first stretchable base, and having stretchability;
a reinforcement base having in-plane rigidity higher than that of the first stretchable base; and
a draw-out wiring portion formed on a main surface located on at least one side of the reinforcement base,
a second stretchable base; and
a stretchable connecting wiring portion formed on a main surface located on at least one side of the second stretchable base, and having stretchability, in which
the main surface of the second stretchable base faces and is overlaid with the main surface of the first stretchable base and the main surface of the reinforcement base on a side of the draw-out wiring portion,
a part of the stretchable wiring portion and a part of the stretchable connecting wiring portion are joined together,
a part of the draw-out wiring portion and a part of the stretchable connecting wiring portion are joined together, and
the stretchable wiring portion and the draw-out wiring portion are electrically continuous with each other through the stretchable connecting wiring portion.

10. The stretchable circuit board according to claim 9, wherein
a main surface of the reinforcement base located on a side opposite to the draw-out wiring portion and the main surface of the first stretchable base are joined together.

11. The stretchable circuit board according to claim 9, wherein
a part of the stretchable wiring portion and a part of the stretchable connecting wiring portion are integrally fused, and
a part of the draw-out wiring portion and a part of the stretchable connecting wiring portion are integrally fused.

12. The stretchable circuit board according to claim 9, wherein
the main surface of the second stretchable base is joined directly with the main surface of the first stretchable base and the main surface of the reinforcement base on the side of the draw-out wiring portion, and covers at least a part of the main surface of the first stretchable base and at least a part of the main surface of the reinforcement base.

13. The stretchable circuit board according to claim 12, wherein
the main surface of the second stretchable base entirely covers the stretchable wiring portion and the draw-out wiring portion except for an electrode portion of the stretchable wiring portion and a terminal portion of the draw-out wiring portion.

14. The stretchable circuit board according to claim 9, wherein
the stretchable wiring portion, the draw-out wiring portion, and the stretchable connecting wiring portion are made from an electrically conductive material prepared in a manner such that an electrically conductive particle is dispersed in a resin material, and
the resin material in the electrically conductive material forming the stretchable wiring portion, the draw-out wiring portion, and the stretchable connecting wiring portion belongs to the same type.

15. A method for manufacturing a stretchable circuit board, comprising:
forming a stretchable wiring portion on a main surface located on at least one side of a first stretchable base;
forming a draw-out wiring portion on a main surface located on one side of a reinforcement base having in-plane rigidity higher than that of the first stretchable base;
forming a stretchable connecting wiring portion on a main surface located on at least one side of a second stretchable base; and
overlaying the main surface of the second stretchable base so as to face the main surface of the first stretchable base and the main surface of the reinforcement base on the side of the draw-out wiring portion, joining together a part of the stretchable wiring portion and a part of the stretchable connecting wiring portion, joining together a part of the draw-out wiring portion and a part of the stretchable connecting wiring portion, and causing the stretchable wiring portion and the draw-out wiring portion to be electrically continuous with each other through the stretchable connecting wiring portion.

16. The method for manufacturing a stretchable circuit board according to claim 15, wherein
the first stretchable base, the reinforcement base, and the second stretchable base are heated or pressed to directly join the main surface of the second stretchable base with the main surface of the first stretchable base and the main surface of the reinforcement base,
a part of the stretchable wiring portion and a part of the stretchable connecting wiring portion are integrally fused, and
a part of the draw-out wiring portion and a part of the stretchable connecting wiring portion are integrally fused.

17. The method for manufacturing a stretchable circuit board according to claim 15, further comprising
joining together the main surface of the first stretchable base and a main surface of the reinforcement base located on a side opposite to the draw-out wiring portion.

18. The stretchable circuit board according to claim 1, wherein the stretchable circuit board includes partial areas in planar view, the partial areas including a reinforcement area where the reinforcement base is provided and a stretchable area having in-plane rigidity lower than that of the reinforcement area.

19. The stretchable circuit board according to claim 1, wherein the draw-out wiring portion is connectable to an external device.

* * * * *